(12) United States Patent
Tahavorgar

(10) Patent No.: US 12,021,391 B2
(45) Date of Patent: Jun. 25, 2024

(54) BIDIRECTIONAL POWER TRANSFER SYSTEM, METHOD OF OPERATING THE SAME, AND WIRELESS POWER SYSTEM

(71) Applicant: Solace Power Inc., Mount Pearl (CA)

(72) Inventor: Amir Tahavorgar, Mount Pearl (CA)

(73) Assignee: Solace Power Inc., Mount Pearl (CA)

( * ) Notice: Subject to any disclaimer, the term of this patent is extended or adjusted under 35 U.S.C. 154(b) by 0 days.

(21) Appl. No.: 17/899,711

(22) Filed: Aug. 31, 2022

(65) Prior Publication Data

US 2022/0416582 A1 Dec. 29, 2022

Related U.S. Application Data

(60) Provisional application No. 63/238,829, filed on Aug. 31, 2021.

(51) Int. Cl.
*H02J 50/00* (2016.01)
*H02J 50/05* (2016.01)
(Continued)

(52) U.S. Cl.
CPC .............. *H02J 50/00* (2016.02); *H02J 50/05* (2016.02); *H02J 50/10* (2016.02); *H02J 50/12* (2016.02); *H04L 1/00* (2013.01); *H04W 28/06* (2013.01)

(58) Field of Classification Search
CPC .. H02J 50/00; H02J 50/05; H02J 50/10; H02J 50/12
(Continued)

(56) References Cited

U.S. PATENT DOCUMENTS 9,653,948 B2 5/2017 Polu et al.
9,979,206 B2 5/2018 Nyberg et al.
(Continued)

OTHER PUBLICATIONS

Written Opinion of the International Searching Authority, dated Dec. 6, 2022, issued in International Patent Application No. PCT/CA2022/051314.
(Continued)

*Primary Examiner* — William Hernandez
(74) *Attorney, Agent, or Firm* — Harness, Dickey & Pierce, P.L.C.

(57) ABSTRACT

A bidirectional wireless power transfer system for transferring power comprises a power stage electrically connected to a transceiver element for an electric field and/or a magnetic field, and for extracting power from a generated electric field and/or a generated magnetic field. The power stage is for inverting an inputted power signal and for rectifying a received power signal. The system further comprises a trigger circuit for synchronizing wireless power transfer; and a clock generator for generating a clock signal. The system further comprises a switching element electrically connected to the power stage, and selectively electrically connected to the trigger circuit and the clock generator, such that: when the switching element electrically connects the clock generator to the power stage, the transceiver element is configured to transfer power by generating an electric field and/or a magnetic field, and when the switching element electrically connects the trigger circuit to the power stage, the transceiver element is configured to extract power from a generated electric field and/or a generated magnetic field.

20 Claims, 27 Drawing Sheets

(51) Int. Cl.
  *H02J 50/10* (2016.01)
  *H02J 50/12* (2016.01)
  *H04L 1/00* (2006.01)
  *H04W 28/06* (2009.01)

(58) Field of Classification Search
  USPC .......................................................... 307/104
  See application file for complete search history.

(56) References Cited

U.S. PATENT DOCUMENTS

| | | |
|---|---|---|
| 10,033,225 B2 | 7/2018 | Polu et al. |
| 10,090,709 B2 | 10/2018 | Matsumoto et al. |
| 10,199,877 B2 | 2/2019 | Van Den Brink et al. |
| 10,424,942 B2 | 9/2019 | Nyberg et al. |
| 10,938,244 B2 | 3/2021 | Kawanami et al. |
| 2020/0099254 A1 | 3/2020 | Bartlett et al. |
| 2020/0203997 A1 | 6/2020 | Cove |
| 2020/0203998 A1 | 6/2020 | Almudallal et al. |
| 2020/0227941 A1 | 7/2020 | Almudallal et al. |
| 2021/0021160 A1 | 1/2021 | Bartlett et al. |
| 2021/0083634 A1 | 3/2021 | Aldhaher |
| 2021/0281122 A1 | 9/2021 | Aldhaher |
| 2023/0253828 A1* | 8/2023 | Brower .................. H02J 50/40 307/142 |

OTHER PUBLICATIONS

International Search Report, dated Dec. 6, 2022, issued in International Patent Application No. PCT/CA2022/051314.

* cited by examiner

TX Board

RX Board

BIDIRECTIONAL POWER TRANSFER SYSTEM, METHOD OF OPERATING THE SAME, AND WIRELESS POWER SYSTEM

CROSS-REFERENCE TO RELATED APPLICATION

This application claims the benefit of U.S. Provisional Application No. 63/238,829 filed on Aug. 31, 2021, the entire content of which is incorporated herein by reference.

FIELD

The subject disclosure relates generally to wireless power transfer, and in particular to bidirectional wireless power transfer systems for transferring power, methods of operating the same, and wireless power systems.

BACKGROUND

Wireless power transfer systems such as wireless chargers are becoming an increasingly important technology to enable the next generation of devices. The potential benefits and advantages offered by the technology is evident by the increasing number of manufacturers and companies investing in the technology.

A variety of wireless power transfer systems are known. A typical wireless power transfer system includes a power source electrically connected to a wireless power transmitter, and a wireless power receiver electrically connected to a load.

In magnetic induction systems, the transmitter has a transmitter coil with a certain inductance that transfers electrical energy from the power source to the receiver, which has a receiver coil with a certain inductance. Power transfer occurs due to coupling of magnetic fields between the coils or inductors of the transmitter and receiver. The range of these magnetic induction systems is limited, and the coils or inductors of the transmitter and receiver must be tightly coupled, i.e. have a coupling factor above 0.5 and be in optimal alignment for efficient power transfer.

There also exist resonant magnetic systems in which power is transferred due to coupling of magnetic fields between the coils or inductors of the transmitter and receiver. The transmitter and receiver inductors may be loosely coupled, i.e. have a coupling factor below 0.5. However, in resonant magnetic systems the inductors are resonated using at least one capacitor. Furthermore, in resonant magnetic systems, the transmitter is self-resonant and the receiver is self-resonant. The range of power transfer in resonant magnetic systems is increased over that of magnetic induction systems and alignment issues are rectified. While electromagnetic energy is produced in magnetic induction and resonant magnetic systems, the majority of power transfer occurs via the magnetic field. Little, if any, power is transferred via electric induction or resonant electric induction.

In electrical induction systems, the transmitter and receiver have capacitive electrodes. Power transfer occurs due to coupling of electric fields between the capacitive electrodes of the transmitter and receiver. Similar, to resonant magnetic systems, there exist resonant electric systems in which the capacitive electrodes of the transmitter and receiver are made resonant using at least one inductor. The inductor may be a coil. In resonant electric systems, the transmitter is self-resonant and the receiver is self-resonant. Resonant electric systems have an increased range of power transfer compared to that of electric induction systems and alignment issues are rectified. While electromagnetic energy is produced in electric induction and resonant electric systems, the majority of power transfer occurs via the electric field. Little, if any, power is transferred via magnetic induction or resonant magnetic induction.

While some wireless power transfer systems are known, improvements are desired. It is therefore an object to provide a novel wireless power transfer transmitter, receiver, system and method of wirelessly transferring power.

This background serves only to set a scene to allow a person skilled in the art to better appreciate the following brief and detailed descriptions. Therefore, none of the above discussion should necessarily be taken as an acknowledgement that the discussion is part of the state of the art or is common general knowledge.

BRIEF DESCRIPTION

Accordingly, in one aspect there is provided a bidirectional wireless power transfer system for transferring power.

The system may provide for wireless power transfer in a forward power flow direction, and in opposite reverse power flow direction, which is opposite the forward power flow direction.

The system may comprise: a power stage electrically connected to a transceiver element for transferring power by generating an electric field and/or a magnetic field, and for extracting power from a generated electric field and/or a generated magnetic field, the power stage for inverting an inputted power signal and for rectifying a received power signal; a trigger circuit for synchronizing wireless power transfer; a clock generator for generating a clock signal; and a switching element electrically connected to the power stage, and selectively electrically connected to the trigger circuit and the clock generator, such that: when the switching element electrically connects the clock generator to the power stage, a transceiver element is configured to transfer power by generating an electric field and/or a magnetic field, and when the switching element electrically connects the trigger circuit to the power stage, a transceiver element is configured to extract power from a generated electric field and/or a generated magnetic field.

Operation of the switching element allows for controlled operation of the bidirectional system such that the transceiver element may extract power for receiving power or generate a field for transferring power.

The switching element may be operated manually or autonomously. The switching element may be remotely operated. The switching element may be operated via a controller.

The bidirectional power transfer system forms a transmitter for transferring power by generating a magnetic and/or electric field when the clock generator is electrically connected to the power stage via the switching element. The bidirectional power transfer system forms a receiver for extracting power from a generated magnetic and/or electric field when the trigger circuit is electrically connected to the power stage via the switching element.

The system may comprise the transceiver element.

The clock generator may generate the clock signal to control the power stage. The clock generator may comprise an oscillator.

The power stage may comprise an amplifier. The amplifier may be a class E power amplifier.

The power stage may comprise an input stage for at least one of: optimizing load performance, regulating current or load, and reducing harmonics.

The input stage may comprise a matching network.

The matching network may comprise a single impedance inverter or a double impedance inverter.

The power stage may comprise a gate driver for controlling the power stage. The amplifier may comprise the gate driver electrically connected to a main switch of the amplifier. Control of the gate driver via the oscillator may be used to control operation of the main switch of the amplifier to invert an inputted power signal. Control of the gate driver via the trigger circuit may be used to control operation of the main switch of the amplifier to extract a received power signal.

The trigger circuit may be for controlling operation of the power stage to synchronize a power signal received by the transceiver element.

The trigger circuit may comprise a sampling circuit for sampling current or voltage.

The sampling circuit may be configured to sample a voltage drop.

The sampling circuit may be configured to sample current or sample voltage.

The current being sampled may be load independent. Load independent may be defined as the current being constant with load variation.

The voltage being sampled may be load independent. Load independent may be defined as the voltage being constant with load variation.

The system may further comprise a converter for converting a voltage of a power signal. The converter may be a DC/DC (direct current to direct current) converter. The converter may be a buck-boost converter. The converter may be a bidirectional buck-boost converter.

The transceiver element may transfer power from a power source. The transceiver element may transfer power from the power source to another transceiver element in the forward power flow direction. When operating to transfer power to another transceiver element, the power stage is electrically connected to the clock generator via the switching element.

The transceiver element may transfer power to a load. The transceiver element may extract power from another transceiver element in the reverse power flow direction. The extracted power may be transferred to a load. When operating to extract power from another transceiver element, the power stage is electrically connected to the trigger circuit via the switching element.

The transceiver element may comprise at least one capacitive or inductive element.

The capacitive element may comprise an electrode.

The inductive element may comprise an inductive coil.

According to another aspect there is provided a wireless power transfer system comprising: a first transceiver or transmitter for wirelessly transferring power via magnetic and/or electric field coupling, the transmitter comprising: a first transceiver element for transferring power by generating an electric field and/or a magnetic field, and for extracting power from a generated electric field and/or a generated magnetic field; a first power stage electrically connected to the first transceiver element, the first power stage for inverting an inputted power signal in a forward power flow and for rectifying a received power signal in a reverse power flow; a first trigger circuit for synchronizing wireless power transfer; a first clock generator for generating a clock signal; and a first switching element electrically connected to the first power stage, and selectively electrically connected to the first trigger circuit and the first clock generator, such that: when the first switching element electrically connects the first clock generator to the first power stage, the first transceiver element is configured to transfer power by generating an electric field and/or a magnetic field, and when the first switching element electrically connects the first trigger circuit to the first power stage, the first transceiver element is configured to extract power from a generated electric field and/or a generated magnetic field; a second transceiver or receiver for wirelessly extracting power via magnetic or electric field coupling, the receiver comprising: a second transceiver element for transferring power by generating an electric field and/or a magnetic field, and for extracting power from a generated electric field and/or a generated magnetic field; a second power stage electrically connected to the second transceiver element, the second power stage for inverting an inputted power signal in the reverse power flow direction and for rectifying a received power signal in the forward power flow direction; a second trigger circuit for synchronizing wireless power transfer; a second clock generator for generating a clock signal; and a second switching element electrically connected to the second power stage, and selectively electrically connected to the second trigger circuit and the second clock generator, such that: when the second switching element electrically connects the second clock generator to the second power stage, the second transceiver element is configured to transfer power by generating an electric field and/or a magnetic field to the transmitter or first transceiver, and when the switching element electrically connects the second trigger circuit to the second power stage, the second transceiver element is configured to extract power from a generated electric field and/or a generated magnetic field from the transmitter or first transceiver.

The first transceiver or transmitter may be for wirelessly transferring power in the forward power flow mode, or for wirelessly extracting power in the reverse power flow mode via magnetic and/or electric field coupling.

The second transceiver or receiver may be for wirelessly extracting power in the forward power flow mode, or for wirelessly transferring power in the reverse power flow mode via magnetic or electric field coupling.

When the system is operating in the forward power flow direction, the first transceiver transfers power to the second transceiver. When operating in the forward power flow direction, the first switching element connects the first clock generator to the first power stage, and the second switching element connects the second trigger circuit to the second power stage.

When the system is operating in the reverse power flow direction, the second transceiver transfers power to the first transceiver. When operating in the reverse power flow direction, the first switching element connects the first trigger circuit to the first power stage, and the second switching element connects the second clock generator to the second power stage.

Operating the respective switching element may cause the system to switch between operating in the forward and reverse power flow directions.

The transmitter may further comprise a load and/or power supply. The power supply may be a direct current (DC) power supply. The load may be a DC load.

The power supply may provide an input power signal for wireless power transfer.

The load may be powered via a power signal extracted via wireless power transfer.

The receiver may further comprise a load and/or power supply. The power supply may be a DC power supply. The load may be a DC load.

The power supply may provide an input power signal for wireless power transfer.

The load may be powered via a power signal extracted via wireless power transfer.

The system may comprise any of the features and/or elements described in respect of the bidirectional wireless power transfer system.

According to another aspect there is provided a method of operating a bidirectional wireless power transfer system, the system comprising: a transceiver element for transferring power by generating an electric field and/or a magnetic field, and for extracting power from a generated electric field and/or a generated magnetic field; a power stage electrically connected to the transceiver element, the power stage for inverting an inputted power signal and for rectifying a received power signal; a trigger circuit for synchronizing wireless power transfer; a clock generator for generating a clock signal; and a switching element electrically connected to the power stage, and selectively electrically connected to the trigger circuit and the clock generator, such that: when the switching element electrically connects the clock generator to the power stage, the transceiver element is configured to transfer power by generating an electric field and/or a magnetic field, and when the switching element electrically connects the trigger circuit to the power stage, the transceiver element is configured to extract power from a generated electric field and/or a generated magnetic field, the method comprising: connecting the power stage to the trigger circuit to extract power, or connecting the power stage to the clock generator to transfer power.

Opposite may be defined as operating in the contrary direction with respect to the transfer of wireless power. For example, a transmitter may transfer power to a receiver, and in the opposite direction a receiver may transfer power to the transmitter.

Connecting the power stage to the trigger circuit or the clock generator may comprise operating the switching element.

The method may further comprise disconnecting the power stage from the clock generator or disconnecting the power stage from the trigger circuit.

Disconnecting the power stage from the trigger circuit or the clock generator may comprise operating the switching element.

Connecting the power stage to the trigger circuit to extract power, or connecting the power stage to the clock generator to transfer power may be automated. This automated connection may be controlled by a controller. The controller may operate to connect the elements in response to a detected signal such as an impedance, resistance, pressure, temperature, etc.

The method may provide any of the advantages discussed in respect of the described system, and vice versa.

In another aspect there is provided a computer-readable medium comprising instructions that, when executed by a processor, perform any of the described methods.

The computer-readable medium may be non-transitory. The computer-readable medium may comprise storage media excluding propagating signals. The computer-readable medium may comprise any suitable memory or storage device such as random-access memory (RAM), static RAM (SRAM), dynamic RAM (DRAM), non-volatile RAM (NVRAM), read-only memory (ROM), or Flash memory.

The processor may have a single-core processor or multiple core processors composed of a variety of materials, such as silicon, polysilicon, high-K dielectric, copper, and so on.

It should be understood that any features described in relation to one aspect, example or embodiment may also be used in relation to any other aspect, example or embodiment of the subject disclosure. Other advantages of the subject disclosure may become apparent to a person skilled in the art from the detailed description in association with the following drawings.

BRIEF DESCRIPTION OF THE DRAWINGS

Embodiments will now be described more fully with reference to the accompanying drawings in which.

DETAILED DESCRIPTION

Figure 1:
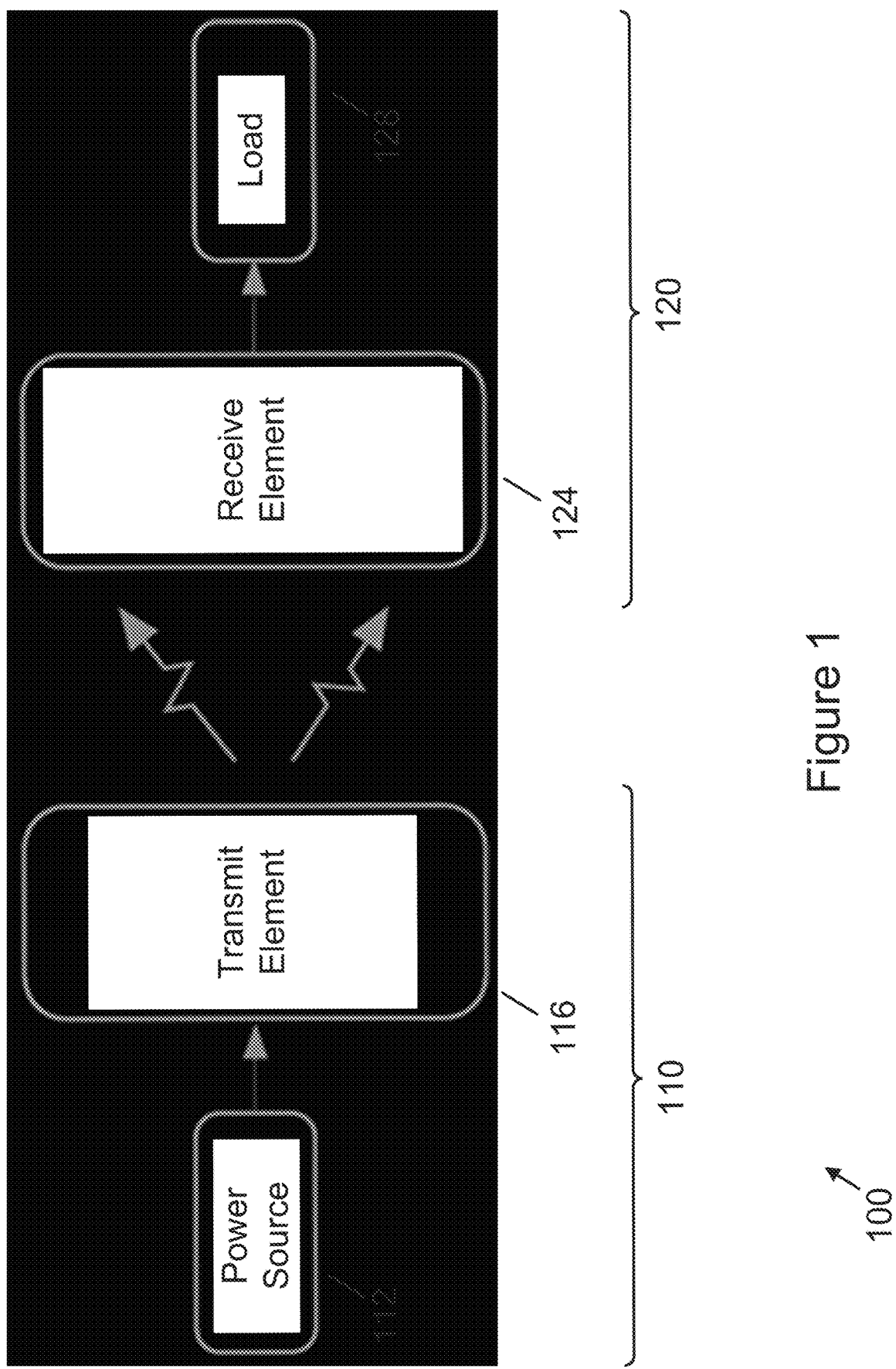
FIG. 1 is a block diagram of a wireless power transfer system.

The foregoing summary, as well as the following detailed description of certain examples will be better understood when read in conjunction with the appended drawings. As used herein, an element or feature introduced in the singular and preceded by the word "a" or "an" should be understood as not necessarily excluding the plural of the elements or features. Further, references to "one example" or "one embodiment" are not intended to be interpreted as excluding the existence of additional examples or embodiments that also incorporate the described elements or features. Moreover, unless explicitly stated to the contrary, examples or embodiments "comprising" or "having" or "including" an element or feature or a plurality of elements or features having a particular property may include additional elements or features not having that property. Also, it will be appreciated that the terms "comprises", "has", "includes" means "including by not limited to" and the terms "comprising", "having" and "including" have equivalent meanings. It will also be appreciated that like reference characters will be used to refer to like elements throughout the description and drawings.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, and/or designed for the purpose of performing the function. It is also within the scope of the subject disclosure that elements, components, and/or other subject matter that is described as being adapted to perform a particular function may additionally or alternatively be described as being configured to perform that function, and vice versa. Similarly, subject matter that is described as being configured to perform a particular function may additionally or alternatively be described as being operative to perform that function.

It will be understood that when an element is referred to as being "on," "attached" to, "connected" to, "coupled" with, "contacting," etc., another element, it can be directly on, attached to, connected to, coupled with or contacting the other element or intervening elements may also be present.

It should be understood that use of the word "exemplary", unless otherwise stated, means by way of example' or 'one example', rather than meaning a preferred or optimal design or implementation.

Turning now to FIG. 1, a wireless power transfer system generally identified by reference numeral 100 is shown. The wireless power transfer system 100 comprises a transmitter 110 comprising a power source 112 electrically connected to a transmit element 116, and a receiver 120 comprising a receive element 124 electrically connected to a load 128. Power is transferred from the power source 112 to the transmit element 116. The power is then transferred from the transmit element 116 to the receive element 124 via resonant or non-resonant electric or magnetic field coupling. The power is then transferred from the receive element 124 to the load 128. Exemplary wireless power transfer systems 100 include a high frequency inductive wireless power transfer system as described in Applicant's U.S. Provisional Application No. 62/899,165, or a resonant capacitively coupled wireless power transfer system as described in Applicant's U.S. Pat. No. 9,653,948, the relevant portions of which are incorporated herein by reference.

Figure 2:
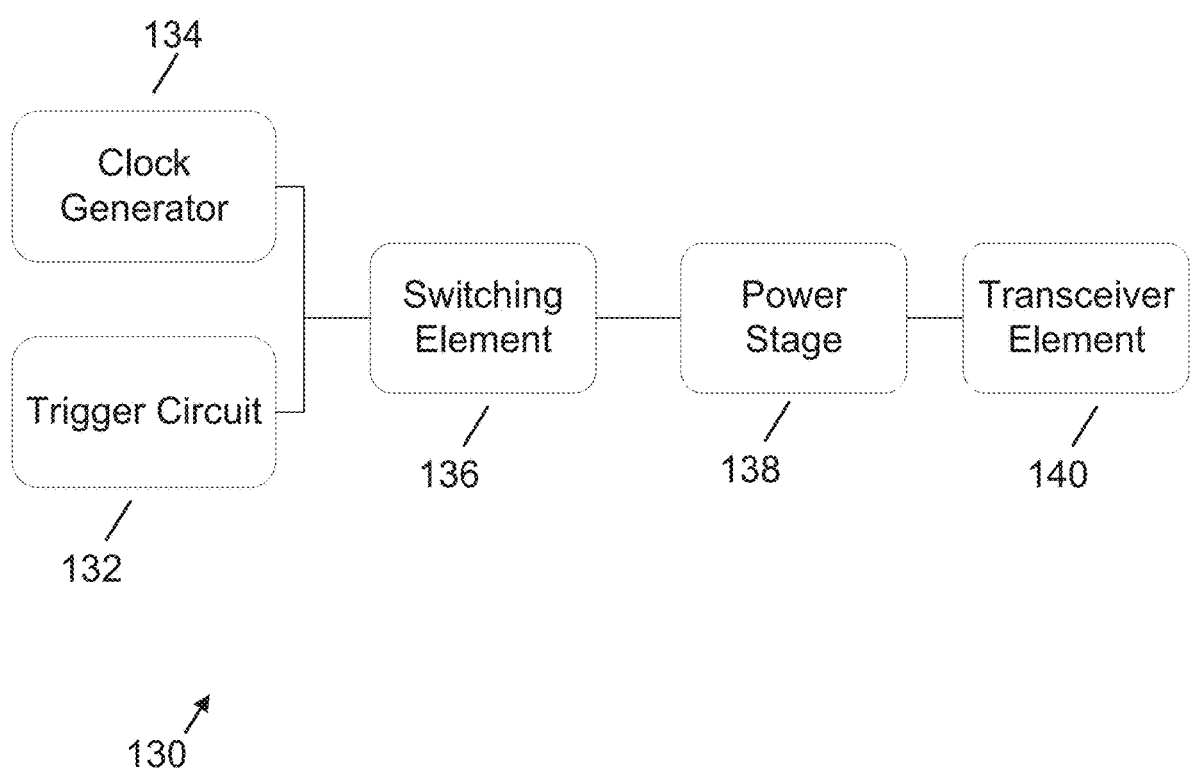
FIG. 2 is a block diagram of a bidirectional wireless power transfer system in accordance with an aspect of the subject disclosure.

In the wireless power transfer system 100, power is transferred from the transmit element 116 to the receive element 124. It may be desirable to be able to transfer power to and from each respective element, i.e., from receive element 124 to transmit element 116. Turning now to FIG. 2, a bidirectional power system generally identified by reference numeral 130 is shown. As will be described, the bidirectional power system 130 is configured to transfer power in a forward power flow direction and extract power in a reverse power flow direction, opposite the forward power flow direction. The bidirectional power system 130 may also transfer power in the reverse power flow direction and extract power in the forward power flow direction. In this context forward and reverse are with reference to the components of the system 130 as will be described.

The bidirectional power system 130 is for transferring power wirelessly. The system 130 comprises a transceiver element 140, a power stage 138, a switching element 136, a trigger circuit 132, and a clock generator 134.

The transceiver element 140 is for transferring power by generating an electric field and/or a magnetic field, and for extracting power from a generated electric field and/or a generated magnetic field. Thus, the transceiver element 140 essentially forms a transmit element for transferring power by generating a magnetic and/or electric field, and a receive element for extracting power from a generated magnetic and/or electric field in a single component. While both electric and magnetic fields have been described the transceiver element 140 may operate to transfer or extract power via a single field, electric or magnetic.

While electromagnetic energy may be produced, the majority of power transfer or extraction may occur via only a single one of electric induction, i.e. via electric field coupling, and magnetic induction, i.e. magnetic field coupling. Little, if any, power is transferred via the other one of magnetic induction and electric induction. Further the induction may be resonant, i.e. resonant magnetic induction or resonant electric induction.

The transceiver element 140 comprises one or more capacitive electrodes and inductive elements, i.e. inductors. The capacitive electrodes may be laterally spaced, elongate electrodes; however, one of skill in the art will appreciate that other configurations are possible including, but not limited to, concentric, coplanar, circular, elliptical, disc, etc., electrodes. Other suitable electrode configurations are described in Applicant's U.S. Pat. No. 9,979,206, the relevant portions of which are incorporated herein by reference. The inductive elements may comprise one or more coils. The coils may include booster or shield coils such as described in Applicant's U.S. patent application Ser. No. 17/193,539, the relevant portions of which are incorporated herein by reference.

The transceiver element 140 is electrically connected to the power stage 138. The power stage 138 is for inverting an inputted power signal and for rectifying a received power signal as will be described. The power stage 138 inverts a power signal and inputs the inverted power signal to the transceiver element 140 for power transfer by generating a magnetic and/or electric field. Further the power stage 138 rectifies a power signal received by the transceiver element 140 by extraction from a generated magnetic and/or electric field.

The switching element 136 is electrically connected to the power stage 140. The switching element 136 is also selectively electrically connected to the clock generator 134 and the trigger circuit 132. While the switching element 136 is described as a single element, one of skill in the art will appreciate the switching element 136 may comprise multiple elements and may form a switching network.

The trigger circuit 132 is for synchronizing wireless power transfer. The trigger circuit 132 controls operation of the power stage 138 to synchronize the power signal being received by the transceiver element 140 as will be described.

The clock generator 134 is for generating a clock signal. In this embodiment the clock generator 134 comprises an oscillator. The clock generator 134 is for providing the clock signal to the power stage 138. The clock signal controls operation of the power stage 138 to invert an inputted power signal. The inverted power signal may then be transferred via wireless power transfer at the transceiver element 140.

Operation of the switching element 136 causes the switching element 136 to electrically connect the power stage 138 to either the trigger circuit 132, or to the clock generator 134.

When the switching element 136 electrically connects the clock generator 134 to the power stage 138, the transceiver element 140 is configured to transfer power by generating an electric and/or magnetic field as previously described. The power stage 138 is for inverting an input power signal such that the transceiver element 140, which receives the inverted power signal, may generate an electric and/or magnetic field. The clock generator 134 provides the clock signal to the power stage 138 for inverting the input power signal.

When the switching element 136 electrically connects the trigger circuit 132 to the power stage 138, the transceiver element 140 is configured to extract power from a generated electric and/or magnetic field as previously described. The power stage 138 is for rectifying a power signal received by the transceiver element by extracting power from a generated electric and/or magnetic field. The trigger circuit 132 controls operation of the power stage 138 to synchronize operation of the power stage 138 with the power signal being received by the transceiver element 140.

Electrically connecting the power stage 138 to the trigger circuit 132 configures the transceiver element 140 to extract power. Electrically connecting the power stage 138 to the clock generator 134 configures the transceiver element 140 to transfer power.

Figure 3A:
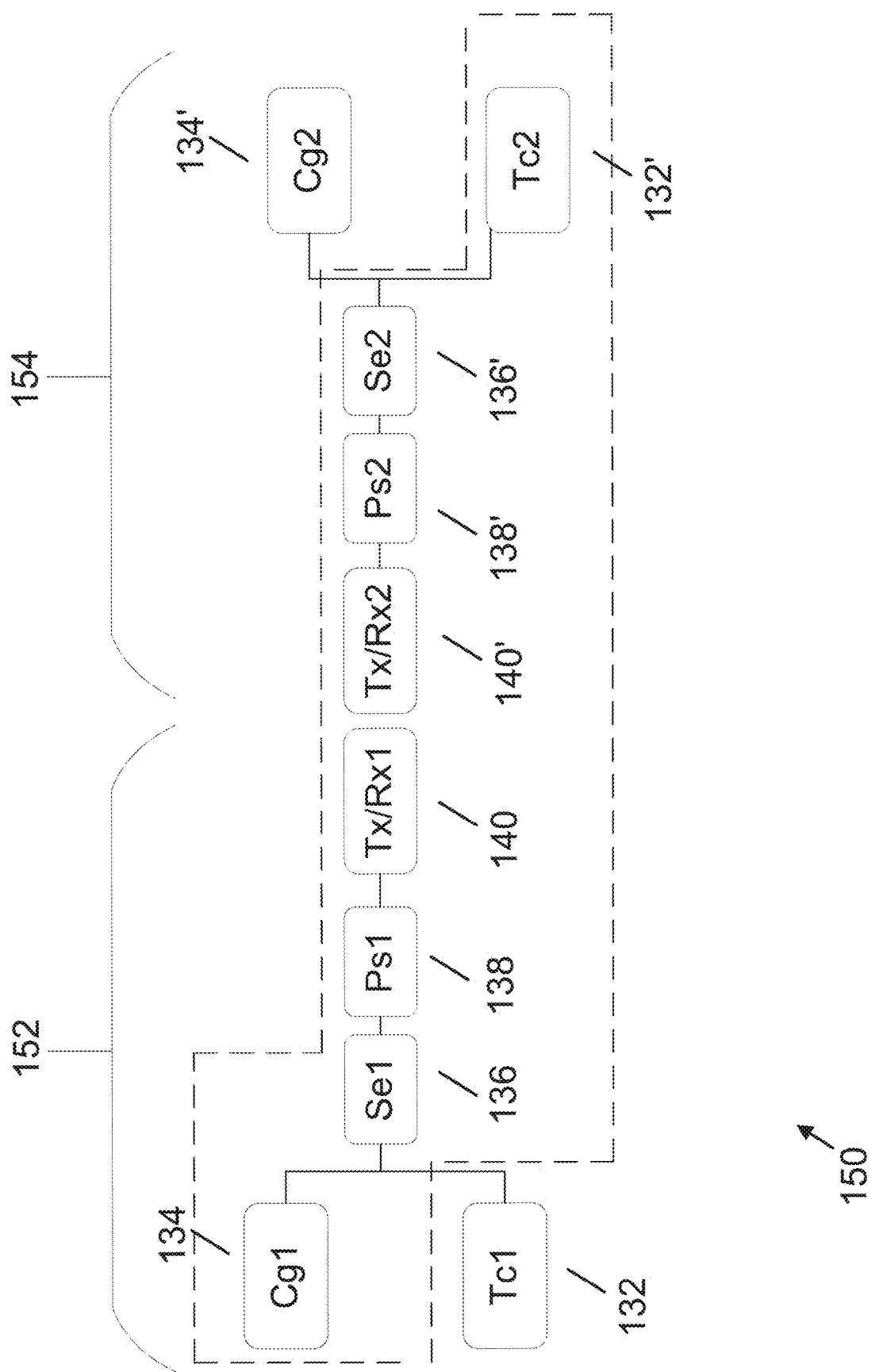
FIG. 3A is a block diagram of a wireless power transfer system operating in a forward power flow direction in accordance with an aspect of the subject disclosure.
Figure 3B:
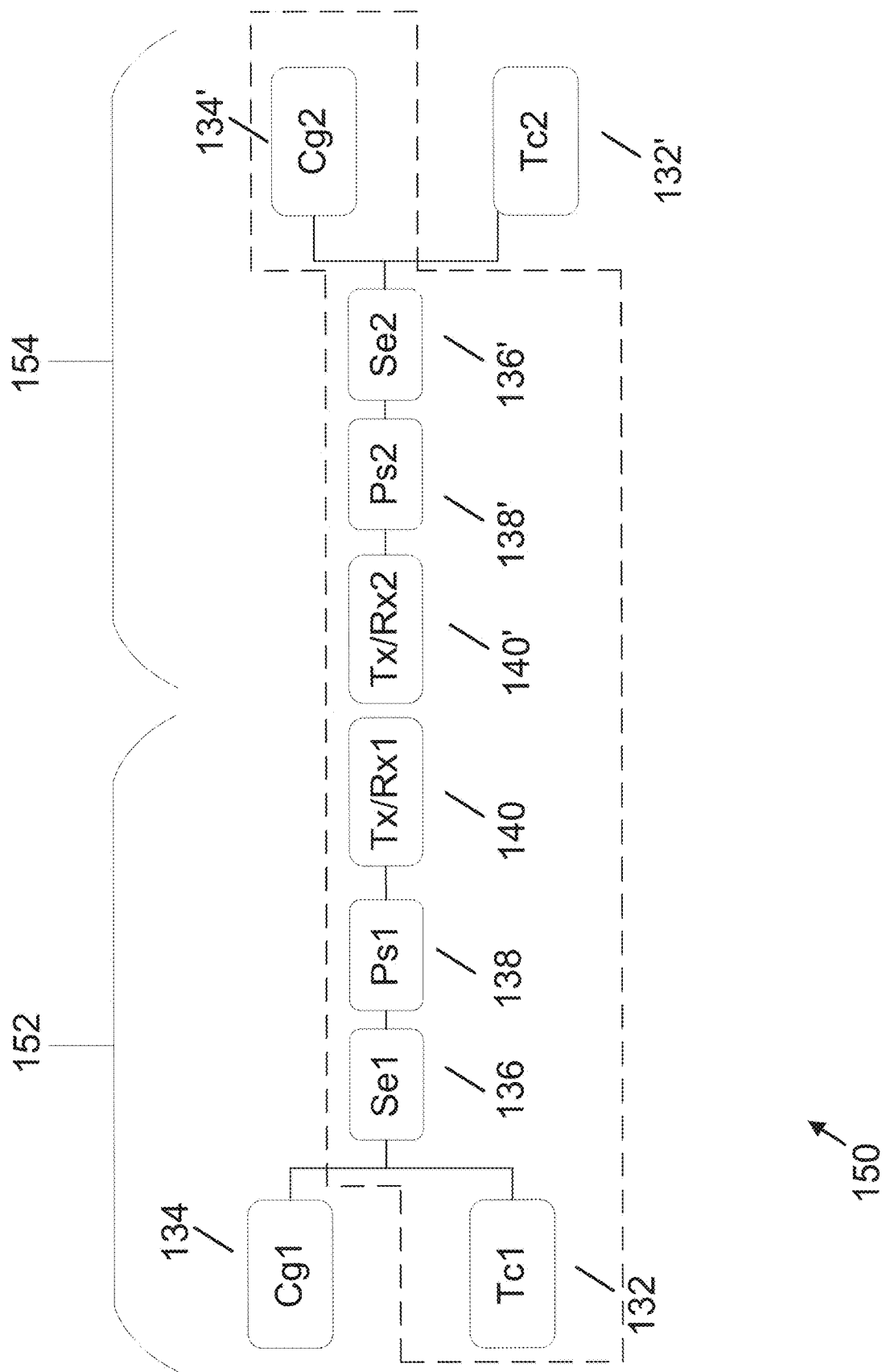
FIG. 3B is a block diagram of the wireless power transfer system of FIG. 3A operating in a reverse power flow direction.

The bidirectional power transfer system 130 may form part of a wireless power transfer system. An exemplary wireless power transfer system is shown in FIGS. 3A and 3B, and is generally identified by reference numeral 150. The wireless power transfer system 150 comprises a first bidirectional power transfer system 152.

The first bidirectional power transfer system 152 forms a transmitter for transferring power by generating a magnetic and/or electric field when the system 150 is operating in the forward power flow direction as shown in FIG. 3A. The first bidirectional power transfer system 152 forms a receiver for extracting power from a generated magnetic and/or electric field when the system 150 is operating in the reverse power flow direction as shown in FIG. 3B. The system 150 further comprises a second bidirectional power transfer system 154.

The second bidirectional power transfer system 154 forms a receiver for extracting power from magnetic and/or electric field generated by the first bidirectional power transfer system 152 (transmitter) when the system 150 is operating in the forward power flow direction as shown in FIG. 3A. The second bidirectional power transfer system 154 forms a transmitter for transferring power to the first bidirectional power transfer system 152 (receiver) by generating a magnetic and/or electric field when the system 150 is operating in the reverse power flow direction as shown in FIG. 3B.

The first bidirectional power transfer system 152 comprises all of the previously described elements of the bidirectional power transfer system 130. The second bidirectional power transfer system 154 comprises the same elements with ' added to reference characters, e.g., transceiver 140'.

In FIG. 3A, the wireless power transfer system 150 is configured to operate in the forward power flow direction such that power is transferred from the first bidirectional wireless power transfer system 152 to the second bidirectional power transfer system 154. The switching element 136 of the first bidirectional wireless power transfer system 152 electrically connects the power stage 138 to the clock generator 134. The switching element 136' of the second bidirectional power transfer system 154 electrically connects the power stage 138' to the trigger circuit 132'. These connections and the subsequent power transfer are outlined in a dashed line.

In FIG. 3B, the wireless power transfer system 150 is configured to operate in the reverse power flow direction such that power is transferred from the second bidirectional power transfer system 154 to the first bidirectional wireless power transfer system 152. The switching element 136' of the second bidirectional power transfer system 154 electrically connects the power stage 138' to the clock generator 134'. The switching element 136 of the first bidirectional power transfer system 152 electrically connects the power stage 138 to the trigger circuit 132. These connections and the subsequent power transfer are outlined in a dashed line.

While not shown in FIG. 3A and 3B, the bidirectional power transfer systems 152, 154 may further comprise power sources for generating input power signals for transferring power and loads for receiving extracted power.

Further, while the wireless power transfer system 150 has been described as comprising two bidirectional power transfer systems 152, 154, one of skill in the art will appreciate other configurations are possible. For example, the wireless power transfer system 150 may comprise a single bidirectional power transfer system which transfer power to a conventional wireless power transfer receiver, or extracts power from a conventional wireless power transfer transmitter. Exemplary transmitters and receivers are described in Applicant's U.S. Pat. Nos. 9,653,948, 10,424,942, and 10,033,225; and U.S. Patent Application Publication Nos. 2021/0021160, 2020/0227941, 2020/0203997, 2020/0203998, and 2020/0099254, the relevant portions of which are incorporated herein by reference.

Figure 4:
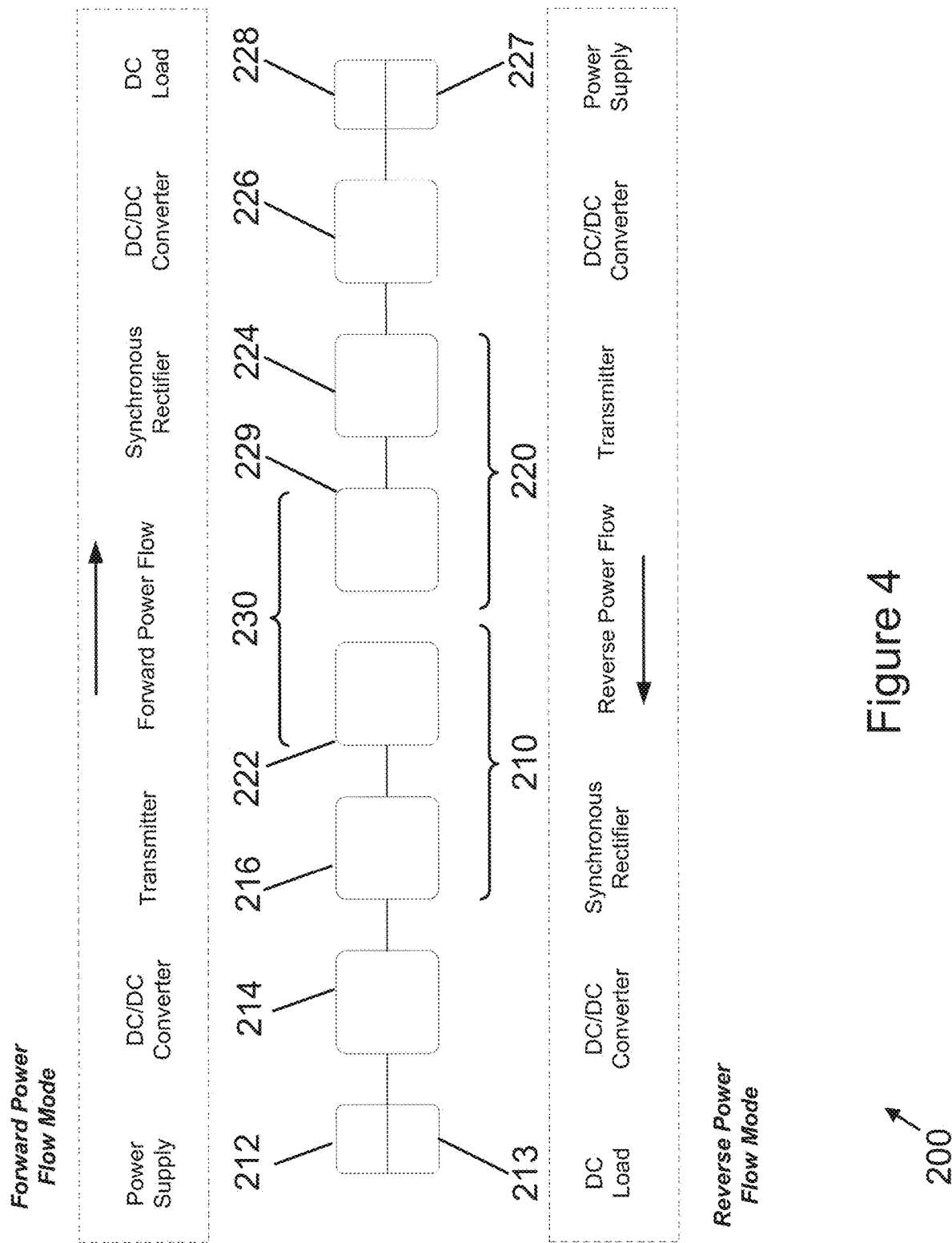
FIG. 4 is a block diagram of a wireless power transfer system in accordance with an aspect of the subject disclosure.

Turning now to FIG. 4, another embodiment of the wireless power transfer system is shown generally identified by reference numeral 200. The wireless power transfer system comprises a first bidirectional power transfer system 210 and a second bidirectional power transfer system 220.

In the forward power flow direction, the first bidirectional power transfer system 210 operates as a transmitter to transfer power to the second bidirectional power transfer system 220, which operates as a receiver extracting power from magnetic and/or electric fields generated by the transmitter. In the reverse power flow direction, the second bidirectional power transfer system 220 operates as a transmitter to transfer power to the first bidirectional power transfer system 210, which operates as a receiver extracting power from magnetic and/or electric fields generated by the transmitter.

The wireless power transfer system 200 comprises a power supply 212, load 213, DC/DC converter 214, and the first bidirectional power transfer system 210. The first bidirectional power transfer system 210 comprises circuitry 216, and transceiver element 222. The power supply 212 and load 213 are electrically connected to the DC/DC converter 214. The DC/DC converter 214 is electrically connected to circuitry 216. The circuitry 216 is electrically connected to the transceiver element 222.

The power supply 212 is for generating an input power signal for transmission of power. In this embodiment, the input power signal is a DC power signal. In this embodiment, the load 213 is a DC load. The load 213 may be static or variable. While the power supply 212 and load 213 are depicted as a single block, they comprise two separate electrical components.

The DC/DC converter 214 is for converting a received DC voltage signal to a desired voltage level. The received DC voltage may be from the circuitry 216 or the power supply 212 as will be described. While the first bidirectional power transfer system 210 comprises the DC/DC converter 214, one of skill in the art will appreciate other configurations are possible. In another embodiment, no DC/DC converter is present.

The circuitry 216 comprises the previously described clock generator 134, trigger circuit 132, switching element 136, and power stage 138.

The transceiver element 222 comprises one or more capacitive electrodes and inductive elements, i.e., inductors. The capacitive electrodes may be laterally spaced, elongate electrodes; however, one of skill in the art will appreciate that other configurations are possible including, but not limited to, concentric, coplanar, circular, elliptical, disc, etc., electrodes. Other suitable electrode configurations are described in aforementioned U.S. Pat. No. 9,9792,06. The inductive elements may comprise one or more coils. The coils may include booster or shield coils such as described in aforementioned U.S. patent application Ser. No. 17/193,539.

When operating in the forward power flow direction, the power source 212 supplies a DC input power signal to the DC/DC converter 214, which converts the signal to a desired voltage level. The circuitry 216 receives the converted DC power signal and functions as an inverter by inverting the converted DC power signal to generate a magnetic and/or electric field at the transceiver element 222 to transfer power. The switching element 136 in the circuitry 216 electrically connects the clock generator 134 to the power stage 138. In the forward power flow direction, the first bidirectional power transfer system 210 acts as a transmitter.

When operating in the reverse power flow direction, the transceiver element 222 extracts power from a generated magnetic and/or electric field generated by the transceiver element 229. The circuitry 216 acts as a synchronous rectifier and rectifies the received power signal. The DC/DC converter 214 converts the rectified power signal to the desired power level, which is received by the load 213. The switching element 136 in the circuitry 216 electrically connects the trigger circuit 132 to the power stage 138. In the reverse power flow direction, the first bidirectional power transfer system 210 acts as a receiver.

The wireless power transfer system 200 comprises a power supply 227, load 228, DC/DC converter 226, and the second bidirectional power transfer system 220. The second bidirectional power transfer system 220 comprises circuitry 224, and transceiver element 229. The power supply 228 and load 227 are electrically connected to the DC/DC converter 226. The DC/DC converter 226 is electrically connected to circuitry 224. The circuitry 224 is electrically connected to the transceiver element 229.

The power supply 228 is for generating an input power signal for transmission of power. In this embodiment, the input power signal is a DC power signal. In this embodiment, the load 227 is a DC load. The load 227 may be static or variable. While the power supply 228 and load 227 are depicted as a single block, they comprise two separate electrical components.

The DC/DC converter 226 is for converting a received DC voltage signal to a desired voltage level. The received DC voltage may be from the circuitry 224 or the power supply 227 as will be described. While the second bidirectional power transfer system 220 comprises the DC/DC converter 226, one of skill in the art will appreciate other configurations are possible. In another embodiment, no DC/DC converter is present.

In this embodiment, the DC/DC converters 214, 226 are bidirectional buck-boost converters. Buck/boost converters may have a DC-DC converter input and an output, which may be used interchangeably.

The circuitry 224 comprises the previously described clock generator 134', trigger circuit 132', switching element 136', and power stage 138'.

The transceiver element 229 comprises one or more capacitive electrodes and inductive elements, i.e. inductors. The capacitive electrodes may be laterally spaced, elongate electrodes; however, one of skill in the art will appreciate that other configurations are possible including, but not limited to, concentric, coplanar, circular, elliptical, disc, etc., electrodes. Other suitable electrode configurations are described in aforementioned U.S. Pat. No. 9,979,206. The inductive elements may comprise one or more coils. The coils may include booster or shield coils such as described in aforementioned U.S. patent application Ser. No. 17/193, 539.

The transceiver elements 222, 229 of the bidirectional power transfer systems 210, 220 form a wireless link 230. The transceiver elements 222, 229 are separated by a wireless gap. The wireless gap may be formed by atmosphere, i.e. air. Power is transferred from one element to the other across the wireless link 230 via resonant or non-resonant magnetic and/or electric field coupling, i.e. electric or magnetic induction.

When operating in the forward power flow direction, the transceiver element 229 extracts power from a magnetic and/or electric field generated by the transceiver element 222. The circuitry 224 acts as a synchronous rectifies and rectifies the received power signal. The DC/DC converter 226 converts the rectified power signal to the desired power level, which is received by the load 228. The switching element 136' in the circuitry 224 electrically connects the trigger circuit 132' to the power stage 138'. In the forward power flow direction, the second bidirectional power transfer system 220 acts as a receiver.

When operating in the reverse power flow direction, the power source 227 supplies a DC input power signal to the DC/DC converter 226, which converts the signal to a desired voltage level. The circuitry 224 receives the converted DC power signal and functions as an inverter by inverting the converted DC power signal to generate a magnetic and/or electric field at the transceiver element 229 to transfer power. The switching element 136' in the circuitry 224 electrically connects the clock generator 134' to the power stage 138'. In the reverse power flow direction, the second bidirectional power transfer system 220 acts as a transmitter.

Figure 5:
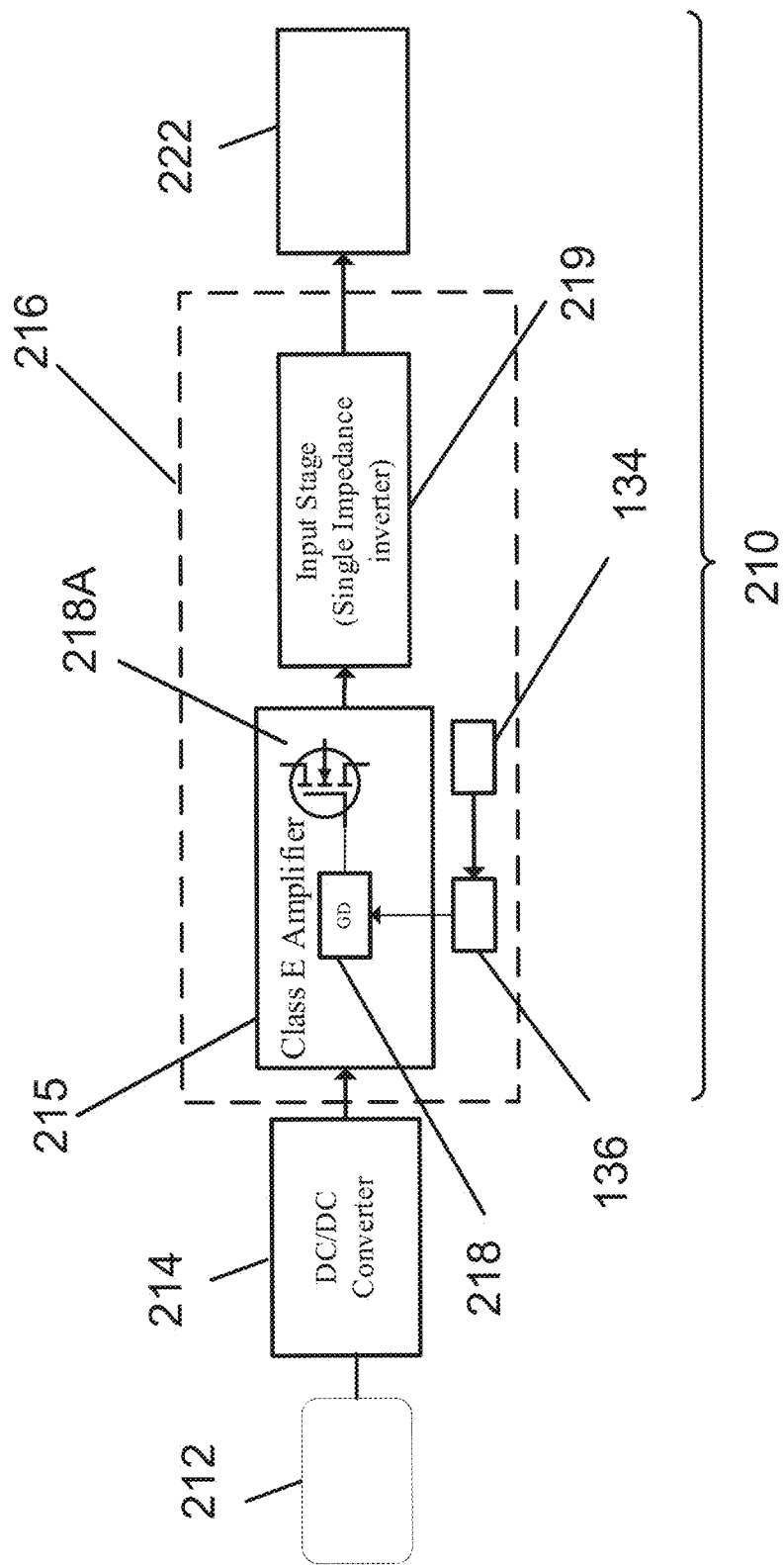
FIG. 5 is a block diagram of a portion of the wireless power transfer system of FIG. 4.

Turning now to FIG. 5, a portion of the wireless power transfer system 200 including the first bidirectional power transfer system 210 is further illustrated. The circuitry 216 is shown surrounded by dashed lines. As previously described, when the first bidirectional power transfer system 210 is operating as a transmitter in the forward power flow direction, the power stage 138 of the circuitry 216 is for inverting an inputted power signal. The switching element 136 electrically connects the power stage 138 to the clock generator 134.

In this embodiment, the circuitry 216 comprises the power stage 138 comprising an amplifier 215, and a matching network or circuit. The circuitry 216 further comprises the switching element 136 and the clock generator 134 electrically connected to the power stage 138.

In this embodiment, the amplifier 215 is a class E amplifier. The amplifier 215 comprises a gate driver 218 and a main switch. The gate driver 218 drives the main switch of the amplifier 215. In this embodiment the main switch comprises an n-type MOSFET 218A. While an n-type MOSFET 218A has been illustrated, one of skill in the art will appreciate other FETs and switching devices may be used. The clock generator 134 is electrically connected to the gate driver 218 via the switching element 136. The clock generator 134 comprises an oscillator. One of skill in the art will appreciate that the clock generator 134 may comprise any uncontrollable signal generator.

As previously stated, the power stage 138 comprises a matching network or circuit. Various matching networks are possible. In this embodiment, the matching network comprises an input stage, which takes the form of a single stage impedance inverter 219. The single stage impedance inverter 219 is electrically connected to the amplifier 215.

The clock generator 134 is configured to generate a clock signal to control the gate driver 218 connected to the main switch (MOSFET 218A) to invert the inputted power signal from the power source 212 (via the DC/DC converter 214) to an radio frequency (RF) or alternating current (AC) signal. A current at the output of the single stage inverter 219 is load independent.

While the circuitry 216 has been described as having a particular configuration, one of skill in the art will appreciate other designs are also possible. For example, an additional stage can be implemented with 180-degree phase difference in the clock signal of the clock generator 134 to make the circuitry 216 a differential circuit.

Figure 6A:
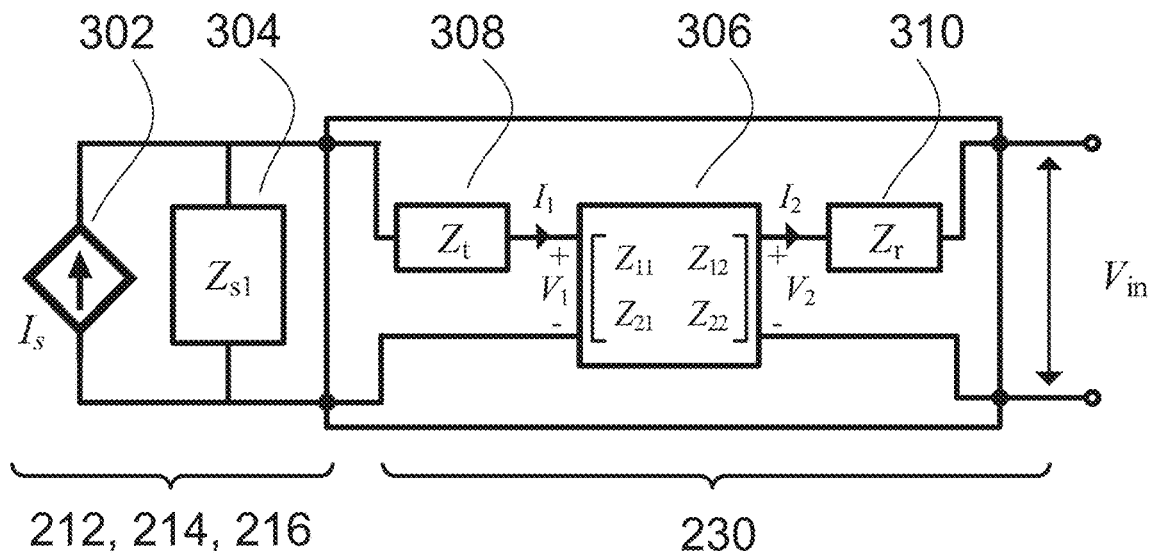
FIG. 6A is an equivalent circuit diagram of a portion of the wireless power transfer system of FIG. 4.

As shown in FIG. 6A, the power supply 212, DC/DC converter 214, and circuitry 216 including the amplifier 215 and single stage impedance inverter 219 can be modelled as a Norton equivalent circuit with a current source 302 generating a current $I_s$ and an impedance source 304 have a finite impedance $Z_{s1}$. The value of $I_s$ depends on the input DC voltage to the circuitry 216. The wireless link 230, including the transceiver elements 222, 229, may be modelled as a Z impedance matrix 306, and tuning impedances 308, 310 having values $Z_t$ and $Z_r$, respectively, which ensures resonance at the switching frequency at the circuitry 216 of the first bidirectional power transfer system 210, and the circuitry 224 of the second bidirectional power transfer system 220.

Figure 6B:
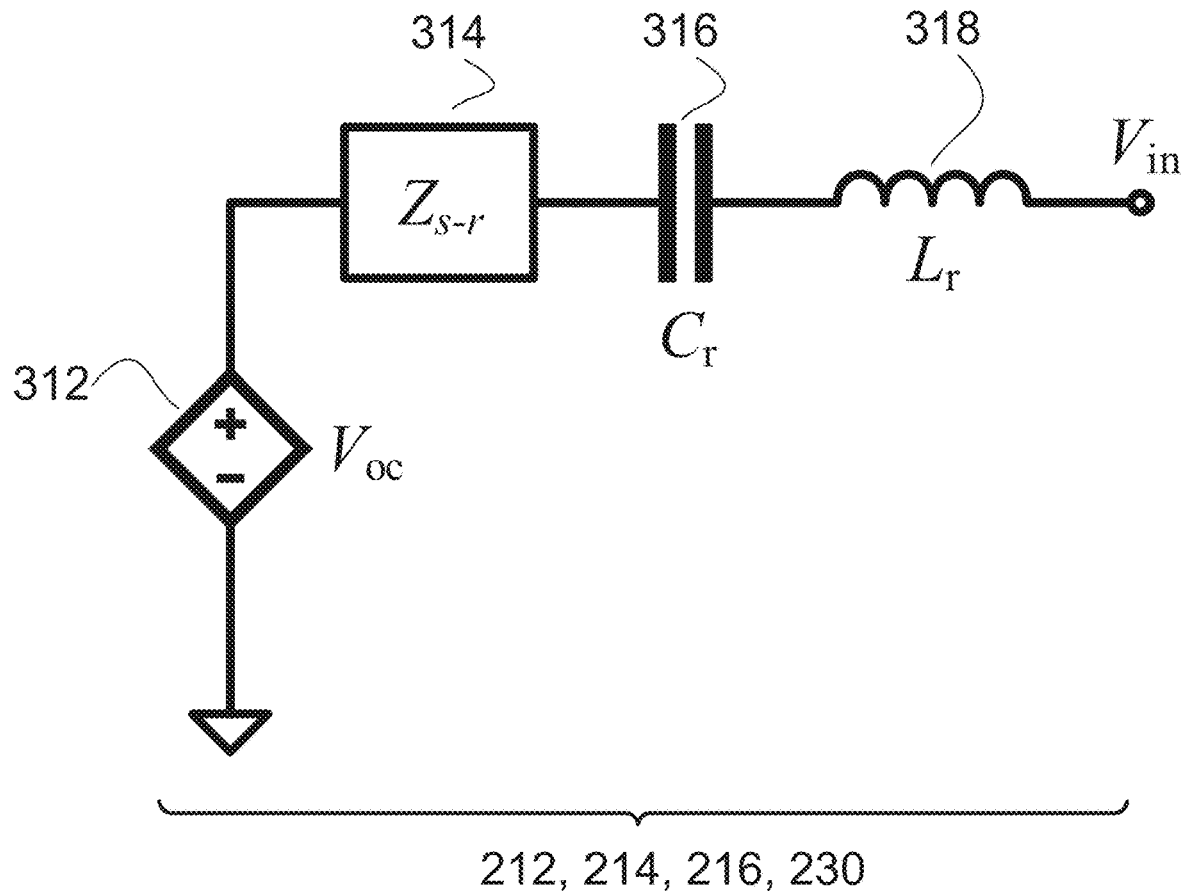
FIG. 6B is another equivalent circuit diagram of a portion of the wireless power transfer system of FIG. 4.

From the perspective of the circuitry 224 of the second bidirectional power transfer system 220, the power supply 212, DC/DC converter 214, circuit 216, and wireless link 230 may also be modelled as a Thevenin equivalent circuit, as shown in FIG. 6B. This equivalent circuit includes a dependent voltage source 312 having a voltage $V_{oc}$, and a source impedance 314 having an impedance of $Z_{(s-r)}$, as well as a series inductor 318 having an inductance $L_r$, and a capacitor 316 having a capacitance $C_r$. The inductor 318 and capacitor 316 resonate at the switching frequency. The values of $V_{oc}$ and $Z_{(s-r)}$ can be calculated based on Is, $Z_{s1}$, $Z_t$, $Z_r$, and the impedance matrix 306 of the wireless link 230 (Z) as shown in Equations 1 and 2 below:

$$V_{oc} = \left(\frac{Z_{s1}Z_{21}}{Z_s + Z_t + Z_{11}}\right)I_s \quad \text{(Equation 1)}$$

$$Z_{s-r} = Z_r + Z_{22} - \frac{Z_{12}Z_{21}}{Z_{s1} + Z_t + Z_{11}} \quad \text{(Equation 2)}$$

For example, at a switching or resonant frequency of 27.12 MHz, a capacitive (electric field coupling) wireless power transfer system using 100Ω resonators, would have a voltage source of $V_{oc}$=36 $V_{rms}$ and a source impedance of $Z_{s-r}$=2.5Ω.

Figure 7:
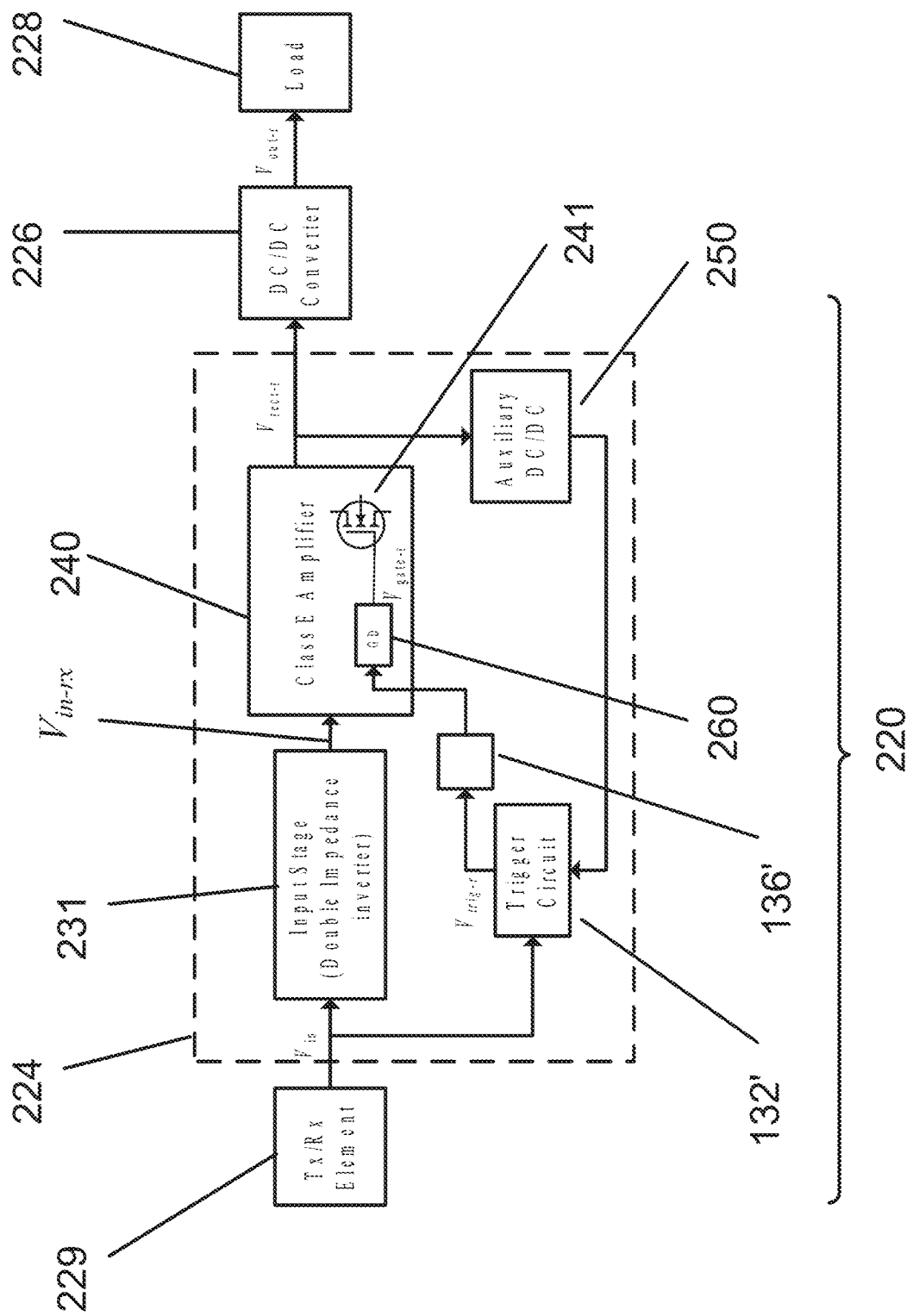
FIG. 7 is a block diagram of a portion of the wireless power transfer system of FIG. 4.

Turning now to FIG. 7, the second bidirectional power transfer system 220, DC/DC converter 226, and load 228 are further illustrated. The circuitry 224 is shown surrounded by dashed lines. As previously described, when the second bidirectional power transfer system 220 is operating as a receiver in the forward power flow direction, the power stage 138' of the circuitry 224 is for rectifying a received power signal. The switching element 136' electrically connects the power stage 138' to the trigger circuit 132'.

In the illustrated arrangement, the circuitry 224 comprises the power stage 138' comprising an amplifier 240 and a matching network or circuit. The circuitry 224 further comprises the switching element 136', the trigger circuit 132', and an auxiliary DC/DC converter 250. The amplifier 240 is electrically connected to the matching network or circuit.

In this embodiment, the amplifier 240 is a class E amplifier although other amplifier configurations are possible. The amplifier 240 comprises a gate driver 260 and a main switch. The gate driver 260 drives the main switch of the amplifier 240. In this embodiment the main switch comprises an n-type MOSFET 241. While an n-type MOSFET 241 has been illustrated, one of skill in the art will appreciate other FETs and switching devices may be used.

Further while a class E amplifier has been illustrated and described other amplifier types are possible as one of skill in the art will appreciate.

The auxiliary DC/DC converter 250 is electrically connected to the trigger circuit 132'. The trigger circuit 132' is electrically connected to the amplifier 240 via the switch 136'. The trigger circuit 132' is further electrically connected to the transceiver 229. The output of the amplifier 240 is electrically connected the DC/DC converter 226 and the auxiliary DC/DC converter 250. The gate terminal of the MOSFET 241 is electrically connected to the gate driver 260.

The gate driver 260 is electrically connected to a main switch (MOSFET 241) of the amplifier 240 such that the amplifier 240 is controlled by the trigger circuit 132' via the gate driver 260 as will be described.

As previously stated, the power stage 138' comprises a matching network or circuit. Various matching networks are possible. In this embodiment, the matching network comprises an input stage, which takes the form of a double stage impedance inverter 231.

In general, in a class E amplifier the performance of the rectifier is optimized for a specified output load, i.e., a desired load. During operation as the output load varies from the desired load, the amplifier DC voltage varies substantially. Furthermore, when the output load varies from the desired load, the zero-voltage-switching (ZVS) operation of the main switch (MOSFET 241) of the amplifier 240 becomes compromised and, consequently, the operation becomes unstable. In contrast, a load-independent class E amplifier retains the ZVS operation of switches of the amplifier 240 from a no-load condition, i.e. zero load, to a full load condition. In addition, the rectified voltage is relatively constant between the no load and full load conditions. The switching losses from the no load condition to the full load condition are approximately constant and performance remains stable.

The class E amplifier design is adapted for converting input RF power to DC. The operating or switching frequencies of the amplifier 240 may be, for example, 6.78 MHz, 13.56 MHz, and 27.12 MHz. The voltage output by the amplifier 240 is $V_{rect-r}$. The RF voltage input into the double stage impedance inverter 230 is $V_{in}$. In this embodiment, the DC voltage, $V_{rect-r}$ is unregulated. As the amplifier 240 comprises a load-independent amplifier, the switch-node waveform does not vary significantly with load as previously described. Thus, the voltage is relatively stable.

The auxiliary DC/DC converter 250 is for converting the $V_{rect-r}$ output by the amplifier 240 to an auxiliary voltage range, e.g. in the range of 5V, $V_{aux-r}$, to power the trigger circuit 132'. The auxiliary signal $V_{aux-r}$ powers the trigger circuit 132'. Until the auxiliary DC/DC converter 250 can regulate, the MOSFET 241 is off and the amplifier 240 acts as a passive (diode) rectifier. In this embodiment, the auxiliary DC/DC converter 250 comprises a low-power buck converter.

The trigger circuit 132' is powered by a signal, e.g. $V_{aux-r}$, from the auxiliary DC/DC converter 250. The trigger circuit 132' samples the RF power $V_{in}$ outputted by the transceiver element 229 and produces an appropriately timed trigger voltage $V_{trig-r}$. The trigger voltage or signal $V_{trig-r}$ is timed such that a gate drive voltage or gate signal $V_{gate-r}$ output by the gate driver 260 is in phase with the input $V_{in}$. The trigger circuit 132' is for ensuring proper timing of the gate drive voltage or gate signal $V_{gate-r}$ output by the gate driver 260. As will be described, the trigger circuit 132' is configured to provide a trigger signal $V_{trig-r}$ that recovers timing using the input signal $V_{in}$. In the illustrated arrangement, the trigger signal $V_{trig-r}$ comprises a pulse signal.

Ideally the main switch (MOSFET 241) of the amplifier 240 is open when the incoming current is positive and closed when the incoming current is negative, resulting in proper rectification. Assuming perfect tuning, $V_{gate-r}$ should be in-phase with $V_{in}$.

The gate driver 260 outputs a signal to switch the MOSFET 241. In particular, the gate driver 260 outputs a gate drive voltage or gate signal, $V_{gate-r}$, to control operation of the amplifier 240, e.g., control switching of the MOSFET 241 of the amplifier 240.

In this embodiment, the gate drive voltage $V_{gate-r}$ is a delayed and more powerful reproduction of the trigger voltage $V_{trig-r}$ input into the gate driver 260.

The gate driver 260 and the trigger circuit 132' exhibit non-negligible propagation delays. To address the challenge of the non-negligible propagation delays from the gate driver 260 and the trigger circuit 132', the trigger circuit 132' is designed such that the trigger circuit 132' further delays the output signal $V_{trig-r}$ to ensure $V_{gate-r}$ is synchronized with $V_{in}$.

As previously stated, the power supply 212, DC/DC converter 214, circuitry 216, and wireless link 230 may be modelled as a Thevenin equivalent circuit, as shown in FIG. 6B. The source impedance $Z_{s-r}$ is small and resistive at the operating frequency.

This model assumes that both transceiver elements 222, 229 are well-tuned, exhibit high unloaded quality factors, and are well-coupled, resulting in high power transfer efficiency across the wireless link 230, i.e., greater than 90%.

As a result, the input voltage $V_{in}$, is a clean sinusoid, which is relatively constant as the load changes, i.e. load independent.

In order for the circuitry 224 of the second bidirectional power transfer system 220 to be load independent, the phase of the pulse, which triggers the MOSFET 241, is independent of the value of the load 228. According to Equation (1), the magnitude of $V_{oc}$ changes by changing $I_s$ thereby changing the DC voltage on the circuitry 216. Assuming a small value for $Z_{s-r}$, the phase of the voltage $V_{in}$ in FIG. 6B may be used to generate the trigger signal for the MOSFET 241 as that phase is not dependent of the value of the load 228.

Figure 8:
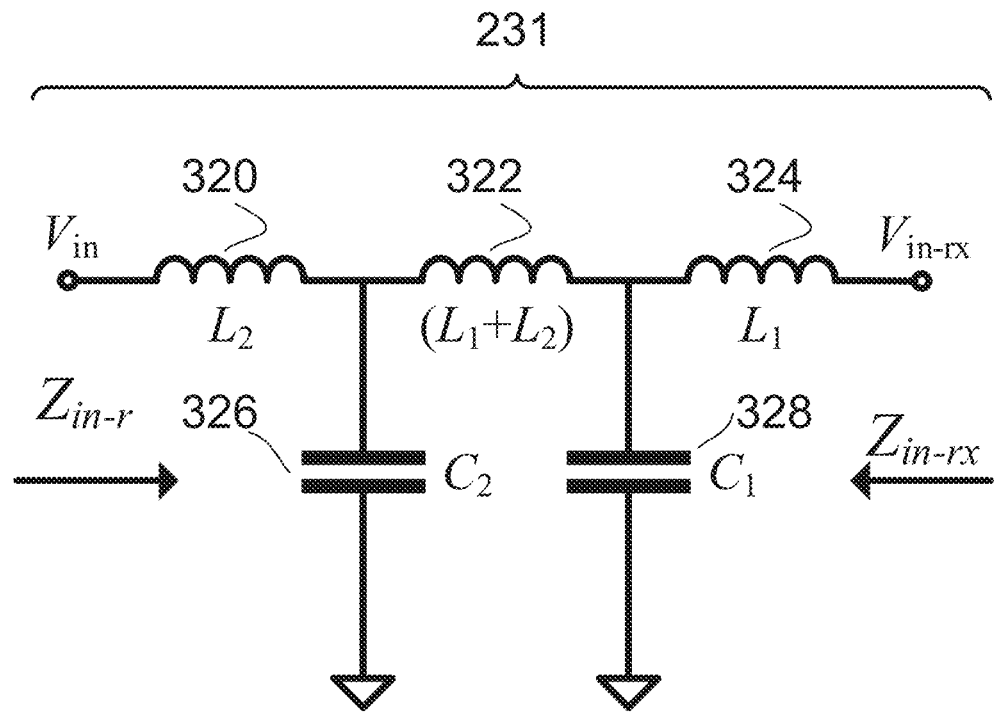
FIG. 8 is circuit diagram of a double impedance inverter of the wireless power transfer system of FIG. 7.

Turning now to FIGS. 8 to 13, the elements of the circuitry 224 of the second bidirectional power transfer system 220 better illustrated. As previously stated, the circuitry 224 comprises a matching network or circuit which, in this arrangement, takes the form of an input stage. The input stage comprises a double impedance inverter 231. An exemplary arrangement of the input stage implemented as a double impedance inverter 231 is depicted in FIG. 8. The double impedance inverter 231 is configured to match the optimum impedance of the circuitry 224 to the impedance at the transceiver element 229. In this embodiment, the double impedance inverter 231 is further configured to reduce harmonic contents generated by the amplifier 240.

As shown in FIG. 8, the double impedance inverter 231 is implemented as two stages of LC "T" networks. The particular two LC "T" networks comprise three series connected inductors 320, 322, 324 having inductances, $L_2$, $L_1+L_2$, and $L_1$, respectively. A capacitor 326 with capacitance $C_2$ is connected in parallel between inductors 320 and 322. A capacitor 328 with capacitance $C_1$ is connected in parallel between inductors 322 and 324. The inductor 320 and capacitor 326 pair, and the inductor 324 and capacitor 328 pair resonate at the switching frequency. The output voltage from the double impedance inverter 231 to the amplifier 240 is $V_{in-rx}$.

The input impedance of the amplifier 240 is $Z_{(in-rx)}$ and the impedance of the transceiver element 229, which extracts power in the forward power flow direction, is $Z_{(in-r)}$. At the switching frequency, the impedances are related by Equation 3 as shown below:

$$Z_{in-r} \cong Z_{in-rx} \left(\frac{C_1}{C_2}\right)^2 \quad \text{(Equation 3)}$$

While a particular network topology has been described, one of skill in the art will appreciate that other matching network topologies are possible, such as a "Pi" or "L" networks.

Figure 9:
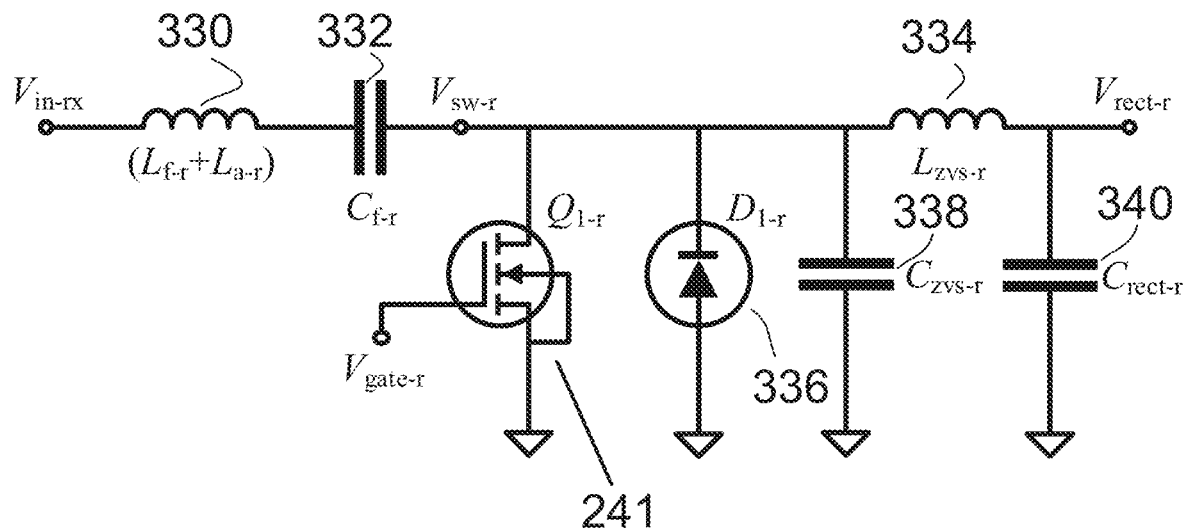
FIG. 9 is a circuit diagram of an amplifier of the wireless power transfer system of FIG. 7.

Turning now to FIG. 9, a circuit diagram of the amplifier 240 is shown. The amplifier 240 converts the input RF signal $V_{in-rx}$ at the switching frequency from the input stage to DC and voltage signal $V_{rect-r}$. In this embodiment, the amplifier 240 comprises a class E amplifier.

The amplifier 240 comprises an inductor 330 having an inductance $L_{f-r}+L_{a-r}$, a capacitor 332 having a capacitance $C_{f-r}$, and an inductor 334 having an inductance $L_{zvs-r}$ all connected in series. The amplifier 240 further comprises a diode 336 indicated as $D_{1-r}$, a capacitor 338 having a capacitance $C_{zvs-r}$, and a capacitor 340 having a capacitor $C_{rect-r}$. The main switch (MOSFET 241), capacitor 338 and diode 336 are connected in parallel between the capacitor 332 and inductor 334. The capacitor 340 is between $V_{rect-r}$ and ground.

Additional filtering of the amplifier 240 input current is achieved via the additional inductance $L_{(f-r)}$ at the inductor 330, and the capacitor 332 having capacitance $C_{(f-r)}$, which are also resonant at the switching frequency. The input current is assumed to be sinusoidal or approximately sinusoidal, such that following design Equations 4 and 5 below can be applied to achieve load-independence and zero-voltage-switching (ZVS) at 50% duty cycle of the MOSFET 241:

$$1.2915\omega_0 = \frac{1}{\sqrt{L_{ZVS-r}(C_{ZVS-r} + C_{j-r} + C_{oss-r})}} \quad \text{(Equation 4)}$$

$$L_{a-r} = 0.2663 L_{ZVS-r} \quad \text{(Equation 5)}$$

where $\omega_0$ is the radian switching frequency,
$C_{(j-r)}$ is the junction capacitance of the diode 336,
$C_{oss-r}$ is the output capacitance of the MOSFET 241 at the drain terminal $Q_{1-r}$, and
$L_{a-r}$ is a portion of the series inductance of the inductor 330 required for proper ZVS.

Although the rectified DC voltage, $V_{rect-r}$, is unregulated, the implementation of a load-independent topology ensures that the switch-node waveform does not vary significantly with load. Thus, the rectified voltage is relatively stable and the amplifier 240 is load-independent.

While a class E amplifier is depicted other amplifiers are possible. For example, an identical stage may be added to the amplifier depicted. In this configuration, complementary gate signal compared with signal $V_{gate-r}$ and connected to signal $V_{rect-r}$ can be added to make a differential class E amplifier 240 stage.

The load may require a particular voltage, thus, the previously described DC/DC converter 226 may be used to provide a desired output voltage. The DC/DC converter 226 converts $V_{rect-r}$ to $V_{out-r}$.

The trigger circuit 132' is configured to synchronize wireless power transfer. The trigger circuit 132' controls operation of the gate driver 260 and therefore the amplifier 240 to synchronize operation of the amplifier 240 with the power signal being received by the transceiver element 229.

Timing recovery is required to ensure proper switching of the MOSFET 241. Ideally, the synchronous MOSFET 241 is in the open position when the incoming current is positive and closed when the incoming current is negative, resulting in rectification. Assuming the input stage 230 is perfectly tuned, this means $V_{gate-r}$ should be perfectly in-phase with $V_{in}$. To achieve this, the trigger circuit 132' samples $V_{in}$, and produces an appropriately timed trigger voltage $V_{trig-r}$ for the gate driver 260.

Both the gate driver 260 and the trigger circuit 132' exhibit non-negligible propagation delays. To address these non-negligible propagation delays, the trigger circuit 132' is designed such that it further delays the signal until $V_{gate-r}$ is synchronized with $V_{in}$.

Thus, the trigger circuit 132' is an "RX time recovery trigger circuit". The trigger circuit 132' operates to achieve synchronous rectification in the forward power flow direction.

Figure 10:
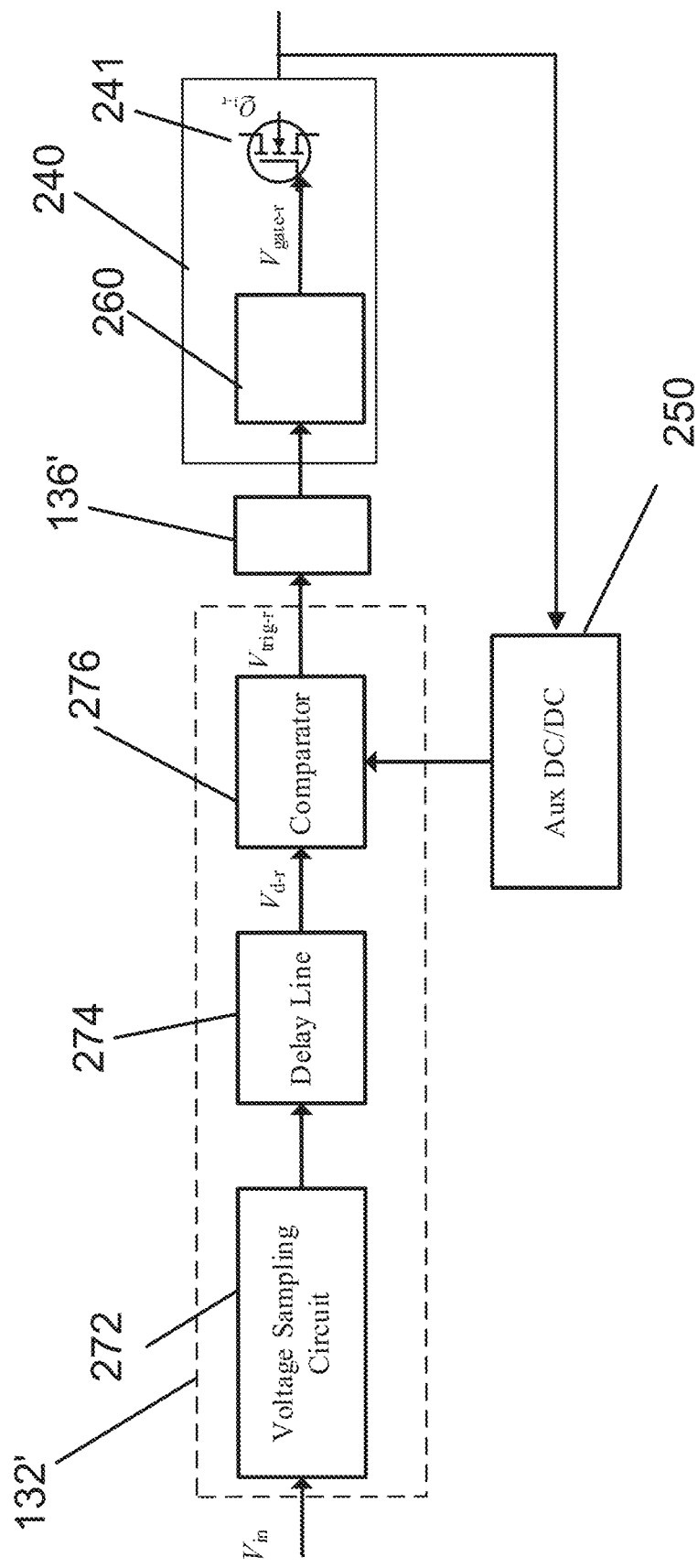
FIG. 10 is a block diagram of a trigger circuit, switching element, auxiliary DC/DC converter, and amplifier of the wireless power transfer system of FIG. 7.

Turning now to FIG. 10, a block diagram of the trigger circuit 132', switching element 136', auxiliary DC/DC converter 250, and amplifier 240 is depicted. The trigger circuit 132' is outlined in dashed lines and receives an extracted power signal at an input voltage $V_{in}$ from the transceiver element 229. The trigger circuit 132' is electrically connected to the amplifier 240 via the switching element 136' and to the auxiliary DC/DC converter 250. In particular, the trigger circuit 132' is electrically connected to the gate driver 260 of the amplifier 240 via the switching element 136' as shown in FIG. 7. The amplifier 240 is electrically connected to the auxiliary DC/DC converter 250.

The gate driver 260 of the amplifier 240 produces the appropriate waveform to switch the MOSFET 241 on or off. The associated gate drive voltage, $V_{gate-r}$, is essentially a delayed and more powerful reproduction of the input trigger voltage, $V_{trig-r}$.

As previously stated, the auxiliary DC/DC converter 250 powers the trigger circuit 132'.

The trigger circuit 132' comprises a sampling circuit 272, a delay line 274 and a comparator circuit 276. The sampling circuit 272 is a voltage sampling circuit. In this embodiment, the voltage sampling circuit is a voltage divider. The sampled input voltage $V_{in}$, is fed from the voltage divider to a delay line 274. The delay line 274 comprises a lumped element delay circuit. A comparator circuit 276 is used to generate a clock signal by comparing the delayed signal $V_{d-r}$ to a DC level. The resulting trigger voltage $V_{trig-r}$ is fed to the amplifier 240, in particular to the gate driver 260, which converts the trigger voltage to a suitable waveform $V_{gate-r}$ for driving the MOSFET 241 of the amplifier 240. The voltage sampling circuit 272, delay line 274, and comparator circuit 276 are configured such that $V_{gate-r}$ is synchronized with $V_{in}$.

Figure 11:
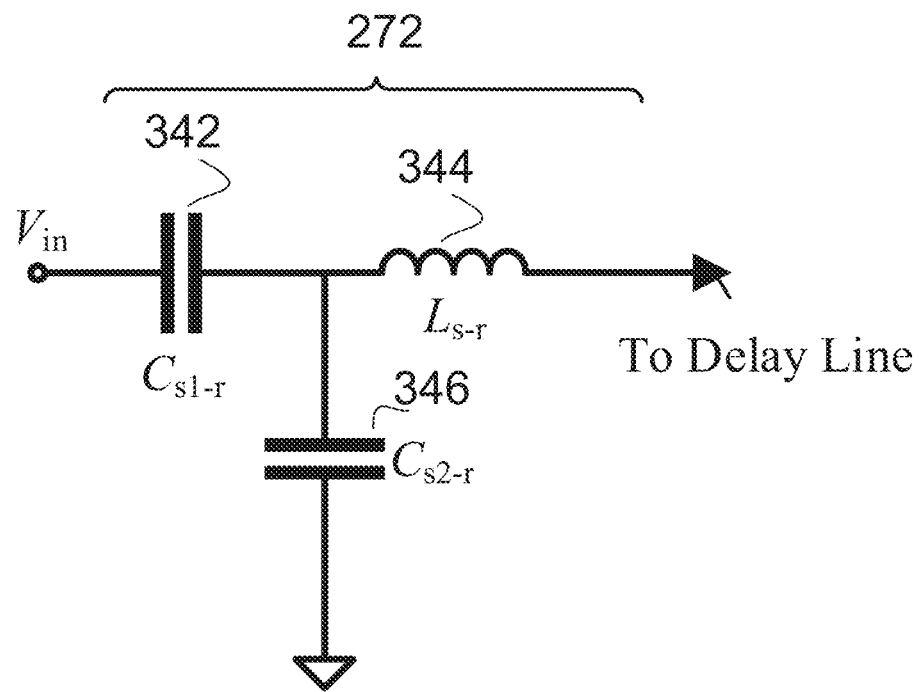
FIG. 11 is a circuit diagram of a sampling circuit of the trigger circuit of FIG. 10.

Turning now to FIG. 11, the sampling circuit 272 is further illustrated. The sampling circuit 272 is a voltage sampling circuit. The sampling circuit 272 is implemented using a capacitive voltage divider network to reduce the amplitude of voltage to a range which is suitable for the comparator circuit 276. The voltage divider network comprises a capacitor 342 having a capacitance $C_{s1-r}$, an inductor 344 having an inductance $L_{s-r}$, and a capacitor 346 having a capacitance $C_{s2-r}$. The capacitor 342 is connected in series to the inductor 344. The capacitor 346 is connected in parallel between the capacitor 342 and the inductor 344.

The inductor 344 is configured to cancel the associated capacitive reactance before the delay line 274.

Figure 12:
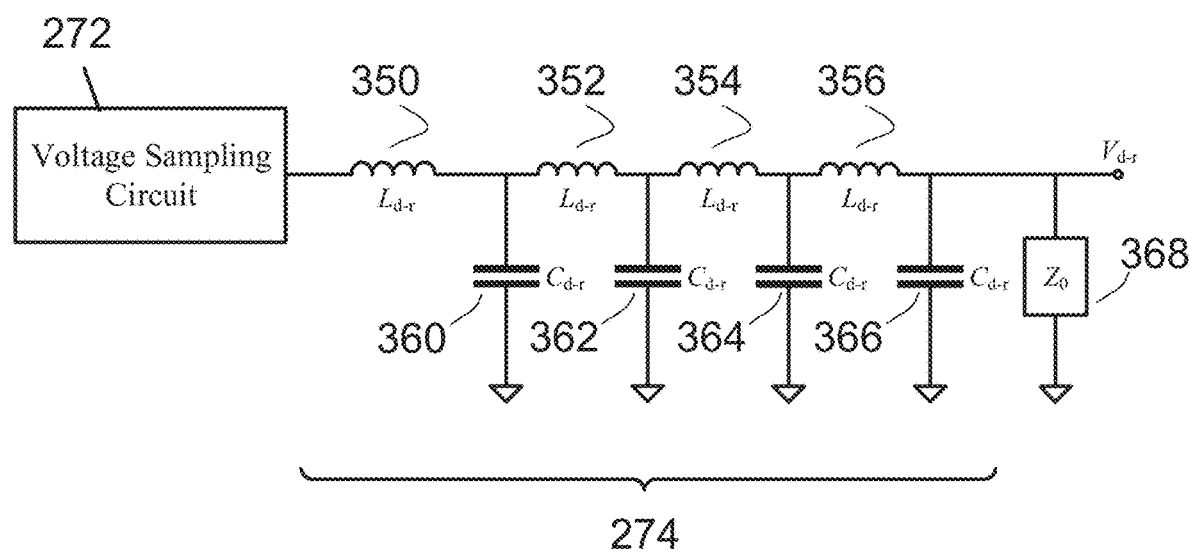
FIG. 12 is a circuit diagram of a portion of the trigger circuit of FIG. 10.

Turning now to FIG. 12, a circuit diagram of the delay line 274 is shown. In this embodiment, the delay line 274 is implemented as a multiple-stage lumped-element transmission line circuit. Each lumped-element comprises LC elements. In the illustrated arrangement, the lumped-element transmission line circuit comprises four (4) lumped-element stages divided evenly along the line circuit. Although FIG. 12 illustrates an evenly split delay line 274, the components in each stage do not necessarily need to be identical and the number of stages can be less or more than four.

While a particular lumped element of passive inductors and capacitors has been described for the delay line 274, one of skill in the art will appreciate that other configurations of delay circuits are possible, such as integrated analog or digital delay circuits.

In the illustrated arrangement, the lumped-element transmission line circuit comprises four (4) inductors 350, 352, 354, 356 arranged in series, and four (4) capacitors 360, 362, 364, 366 arranged in parallel between the inductors 350, 352, 354, 356 and resistor 368 having a resistance value $Z_0$. The total inductance and capacitance associated with the delay line 274, denoted by $L_{dr}$ and $C_{dr}$, respectively, are divided among the inductors 350, 352, 354, 356 and capacitors 360, 362, 364, 366 (the $L_{d-r}$ and $C_{d-r}$ components).

Assuming the delay line 274 is match-terminated, the associated time delay is given by Equation 6 below:

$$\tau_{dr} = \sqrt{L_{dr} C_{dr}} \qquad \text{(Equation 6)}$$

If it is further assumed that the delay line 274 is lossless, the characteristic impedance, $Z_0$, may be given by Equation 7 below:

$$Z_0 = \sqrt{\frac{L_{ax}}{C_{dr}}} \qquad \text{(Equation 7)}$$

As a result, once $Z_0$ and $\tau_d$ are selected, the inductance $L_{d-r}$ of the inductors and capacitance $C_{d-r}$ of the capacitors for a four-stage evenly split delay line, for example, are given by Equation 8 below.

$$L_{d-r} = \frac{Z_0 r_{dr}}{4}, \quad C_{0-r} = \frac{r_{dr}}{4Z_0} \qquad \text{(Equation 8)}$$

The delay is terminated with the resistance 368 having a value of $Z_0$, i.e. the characteristic impedance, and the voltage across this termination is a scaled and delayed version of $V_{in}$ denoted by $V_{d-r}$.

To achieve the exact delay to synchronize $V_{in}$ and $V_{gate-r}$, it may be necessary to reduce or increase delay in one of the stages and have more or less than four stages in the delay line 274. Reducing or increasing the delay in one or more of the stages requires using different inductance or capacitance values for any particular stage. However, the value of the chosen inductor and capacitor must satisfy Equation 7 since the characteristic impedance must be the same.

Figure 13:
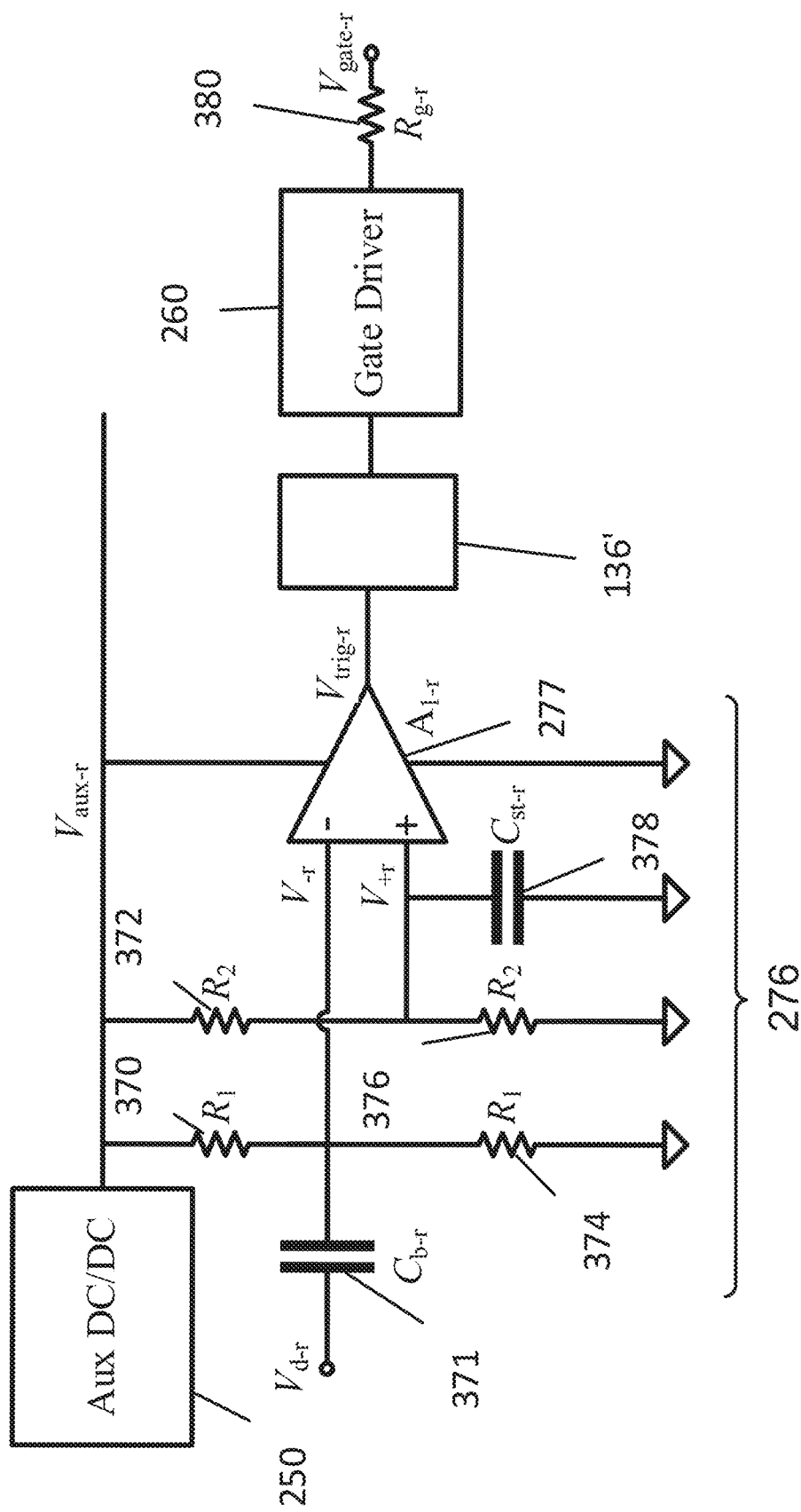
FIG. 13 is a circuit diagram of a portion of the trigger circuit, switching element, and auxiliary DC/DC converter of FIG. 10.

Turning now to FIG. 13, a circuit diagram of a portion of the trigger circuit 132', switching element 136', gate driver 260, and auxiliary DC/DC converter 250 is shown. In particular, the comparator circuit 276 of the trigger circuit 132' is illustrated. The comparator circuit 276 is for generating a clock signal by comparing the delayed signal $V_{d-r}$ output by the delay line 274 to a DC signal. As shown in FIG. 13, the comparator circuit 276 comprises a comparator 277 ($A_{1-r}$) that is powered from the auxiliary DC/DC converter 250 having an auxiliary supply voltage $V_{aux-r}$.

The inputs of the comparator 277 are biased to roughly half of $V_{aux-r}$. For the positive comparator input $V_{+r}$ this is achieved using two equal-valued resistors 372, 376, each with resistance of $R_2$.

The negative comparator input $V_{-r}$ is achieved using two equal-valued resistors 370, 374, each with resistance of $R_1$.

The delayed voltage signal $V_{d-r}$ output by the delay line 274 is coupled to the negative comparator input $V_{-r}$, via DC blocking capacitor 371 having capacitance $C_{b-r}$ thus the trigger voltage $V_{trig-r}$ will be inverted (180° out-of-phase) relative to the delayed voltage signal $V_{d-r}$. In terms of the total delay required to ensure $V_{gate-r}$ is in-phase with $V_{in}$, this effectively accounts for half of the switching period, thus reducing the burden on the delay line 274. As a result, the total delay ($\tau_{dr}$) is given by Equation 9 below:

$$\tau_{dr} = \frac{T_s}{2} - (\tau_c + \tau_g) \qquad \text{(Equation 9)}$$

where Ts is the switching period, τc is the propagation delay of the comparator 277, and τg is the propagation delay of the gate driver 260.

The output of the gate driver 260 is connected to a resistor 380 having resistance $R_{g-r}$ to provide the gate signal $V_{gate-r}$ to the MOSFET 241.

On start-up, the output voltage $V_{out-r}$ will be less than the turn-on voltage of the auxiliary DC/DC converter 250 as the MOSFET 241 of the amplifier 240 is off and the diode 336 is performing rectification. As the output voltage $V_{out-r}$ exceeds this turn-on threshold voltage of the auxiliary DC/DC converter 250, $V_{aux-r}$, will start rising to its nominal value. The presence of capacitor 371 will have the effect of slowing the rise time of negative input $V_{-r}$ to the comparator 277. Unless similar capacitive loading is applied to the positive input $V_{+r}$ of the comparator 277, there may be a significant time interval during which it exceeds the negative input $V_{-r}$ and thus the trigger voltage $V_{trig-r}$ will be high. This may de-stabilize the amplifier 240 and cause damage to the MOSFET 241. Accordingly, a shunt capacitor, 378 which having capacitance $C_{st-r}$ is added to the positive input $V_{+r}$ to ensure that negative input voltage $V_{-r}$ is greater than the positive input voltage $V_{+r}$ during start-up. This capacitance $C_{st-r}$ of the shunt capacitor 378 is chosen to be at least twice the capacitance $C_{b-r}$ of the blocking capacitor 371. In an exemplary arrangement, if $C_{b-r}$ is 200 nF, $C_{st-r}$ may be 470 nF.

As previously stated, when operating in the forward power flow direction the first bidirectional power transfer system 210 operates as a transmitter. The power supply 212 outputs a voltage which is converted by the DC/DC converter 214 to the necessary level. The amplifier 215 of the power stage 138 receives the converted voltage. The gate driver 218 of the amplifier 215 drives the main switch (MOSFET 218A) of the amplifier 215 under the control of the clock signal generated by the clock generator 134 via the switching element 136 to invert the inputted power signal (the converted voltage). The single stage impedance inverter 219 receives this signal to output a current which is load independent. The impedance inverter 219 drives the first transceiver element 222 of the first bidirectional power transfer system 210 to transfer power via wireless coupling (electric and/or magnetic field coupling) to the second transceiver element 229 of the second bidirectional power transfer system 220.

When operating in the forward power flow direction the second bidirectional power transfer system 220 operates as a receiver. The received voltage $V_{in}$ at the second transceiver element 229 is fed to the trigger circuit 132' and the power stage 134' (circuitry 224) of the second bidirectional power transfer system 220. The double stage impedance inverter 231 of the circuitry 224 receives the voltage $V_{in}$ and matches the voltage to the optimum impedance of the circuitry 224. The trigger circuit 132' controls operation of the gate driver 260 of the amplifier 240 via the switching element 136'. Specifically, the trigger circuit 132' samples the input voltage $V_{in}$, and produces an appropriately timed trigger voltage $V_{trig-r}$, for the gate driver 260. The gate driver 260 outputs a gate drive voltage or gate signal, $V_{gate-r}$, to control the operation of the amplifier 240, e.g. control switching of the MOSFET 241 of the amplifier 240, based on the received trigger voltage $V_{trig-r}$ from the trigger circuit 132'. The amplifier 240 then outputs a DC voltage $V_{rect-r}$ to the DC/DC converter 226. The DC/DC converter 226 converts the DC voltage $V_{rect-r}$ to a desired $V_{out-r}$ for the load 228. The DC voltage $V_{rect-r}$ is also used by the auxiliary DC/DC converter 250 to power the trigger circuit 132'.

The wireless power transfer system will now be described when operating in the reverse power flow direction.

Figure 14:
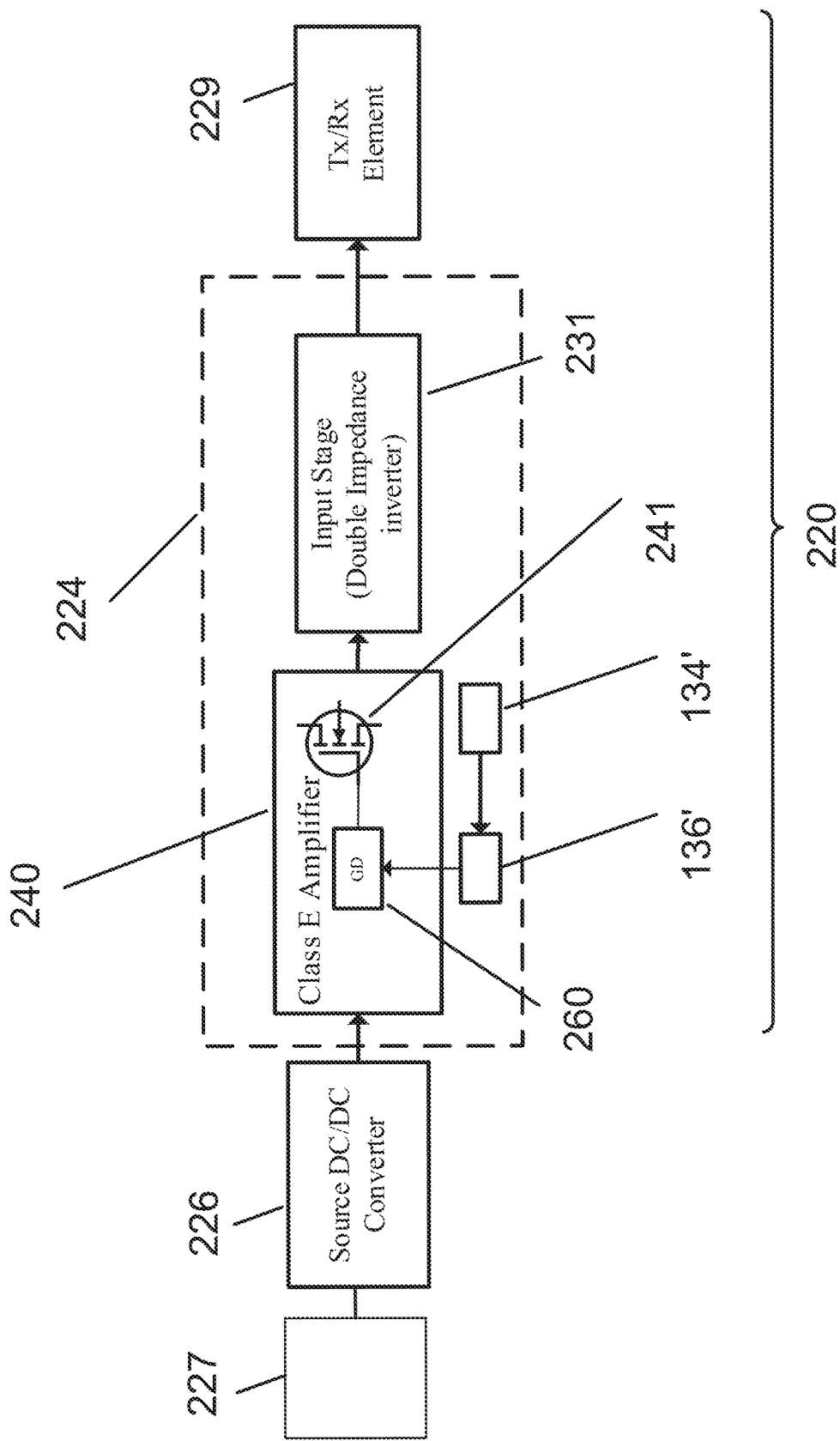
FIG. 14 is a block diagram of a portion of the wireless power transfer system of FIG. 4.

Turning now to FIG. 14, a portion of the wireless power transfer system 200 including the second bidirectional power transfer system 220 is further illustrated. The circuitry 224 is shown surrounded by dashed lines. As previously described when the second bidirectional power transfer system 220 is operating as transmitter in the reverse power flow direction, the power stage 138' of the circuitry 224 is for inverting an inputted power signal. The switching element 136' electrically connects the power stage 138' to the clock generator 134'.

The circuitry 224 comprises a power stage 138' comprising the amplifier 240 and the matching network or circuit. In this embodiment, the matching network or circuit takes the form of the double stage impedance inverter 231.

As previously described, the amplifier 240 is a class E amplifier and comprises the gate driver 260 and a main switch which takes the form of a MOSFET 241. The clock generator 134' is connected to the gate driver 260 via the switching element 136'. The clock generator 134' comprises an oscillator. One of skill in the art will appreciate the clock generator 134' may comprise any uncontrollable signal generator.

The clock generator 134' is configured to generate a clock signal to control the gate driver 260 connected to the main switch (MOSFET 241) to invert the inputted power signal from the power source 227 (via the DC/DC converter 226) to an RF or AC signal. A voltage at the output of the double stage inverter 231 is load independent.

While the circuitry 224 has been described as having a particular configuration, one of skill in the art will appreciate other designs are also possible. For example, an additional stage can be implemented with 180-degree phase difference in the clock signal of the clock generator 134' to make the circuitry 224 a differential circuit.

Figure 15A:
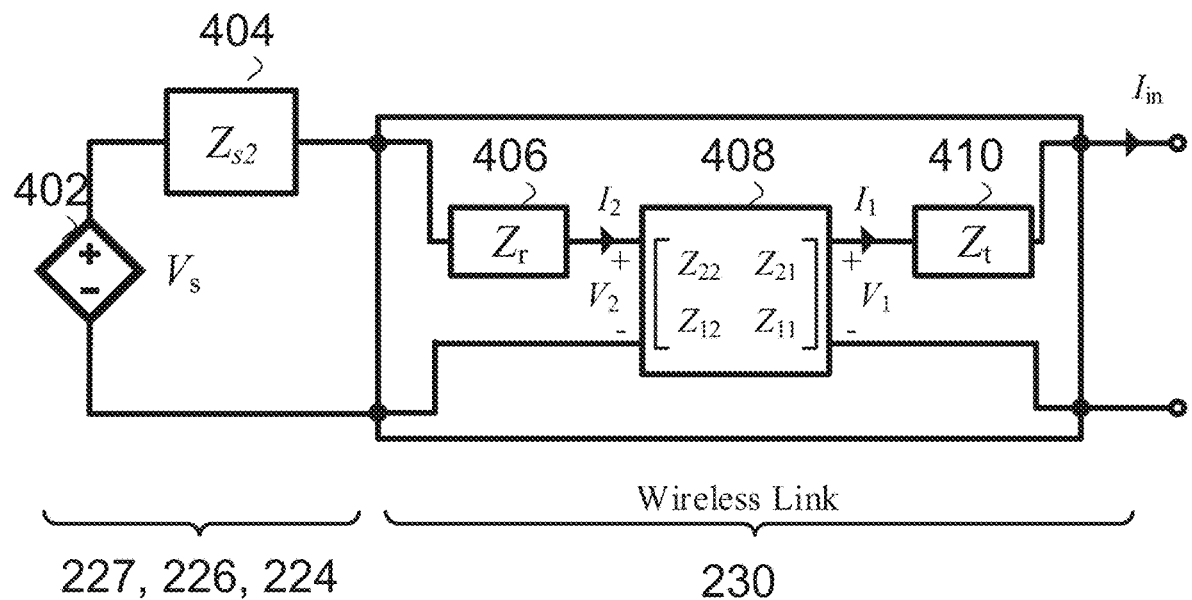
FIG. 15A is an equivalent circuit diagram of a portion of the wireless power transfer system of FIG. 14.

The power supply 227, DC/DC converter 226, and circuitry 224 including the amplifier 240 and double stage impedance inverter 231 can be modelled as a Thevenin equivalent circuit as shown in FIG. 15A. The circuit comprises voltage source 402 generating a voltage $V_s$ and an impedance source 404 having an impedance $Z_{s2}$. The value of $V_s$ depends on the input DC voltage to the circuitry 224. The wireless link 230, including the transceiver elements 222, 229, may be modelled as a Z impedance matrix 408, and tuning impedances 410, 406 having values $Z_t$ and $Z_r$, respectively, which ensures resonance at the switching frequency at the circuitry 224 of the second bidirectional power transfer system 220, and the circuitry 216 of the first bidirectional power transfer system 210.

Figure 15B:
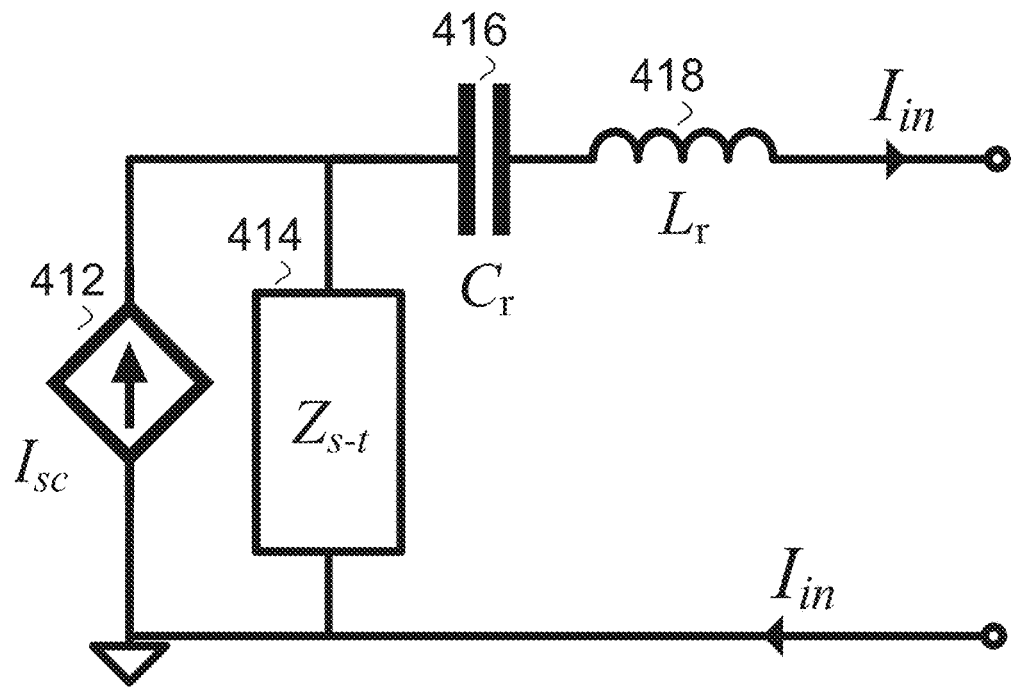
FIG. 15B is another equivalent circuit diagram of a portion of the wireless power transfer system of FIG. 14.

The power supply 227, DC/DC converter 226, circuitry 224 and wireless link 230 may also be modelled as a Norton equivalent circuit, as shown in FIG. 15B. This equivalent circuit includes a dependent current source 412 having a current $I_{sc}$, and a source impedance 414 having a finite source impedance of $Z_{s-t}$, connected in parallel, as well as a series inductor 418 having an inductance $L_r$, and a series capacitor 416 having a capacitance $C_r$. The inductor 418 and capacitor 416 resonate at the switching frequency. The values of $I_{sc}$ and $Z_{s-t}$ can be calculated based on $V_s$, $Z_{s2}$, $Z_t$, $Z_r$ and the impedance matrix of the wireless link 230 (Z) as shown in Equations 10 and 11 below:

$$Z_{s-r} = Z_r + Z_{22} - \frac{Z_{12}Z_{21}}{Z_{s2}Z_t + Z_{11}} \quad \text{(Equation 10)}$$

$$Z_{s-t} = \frac{Z_{11}(Z_{s2} + Z_r + Z_{22}) - Z_{21}Z_{12}}{Z_{s2} + Z_r + Z_{22}} \cong -\frac{Z_{21}Z_{12}}{Z_{s2}} \quad \text{(Equation 11)}$$

Figure 16:
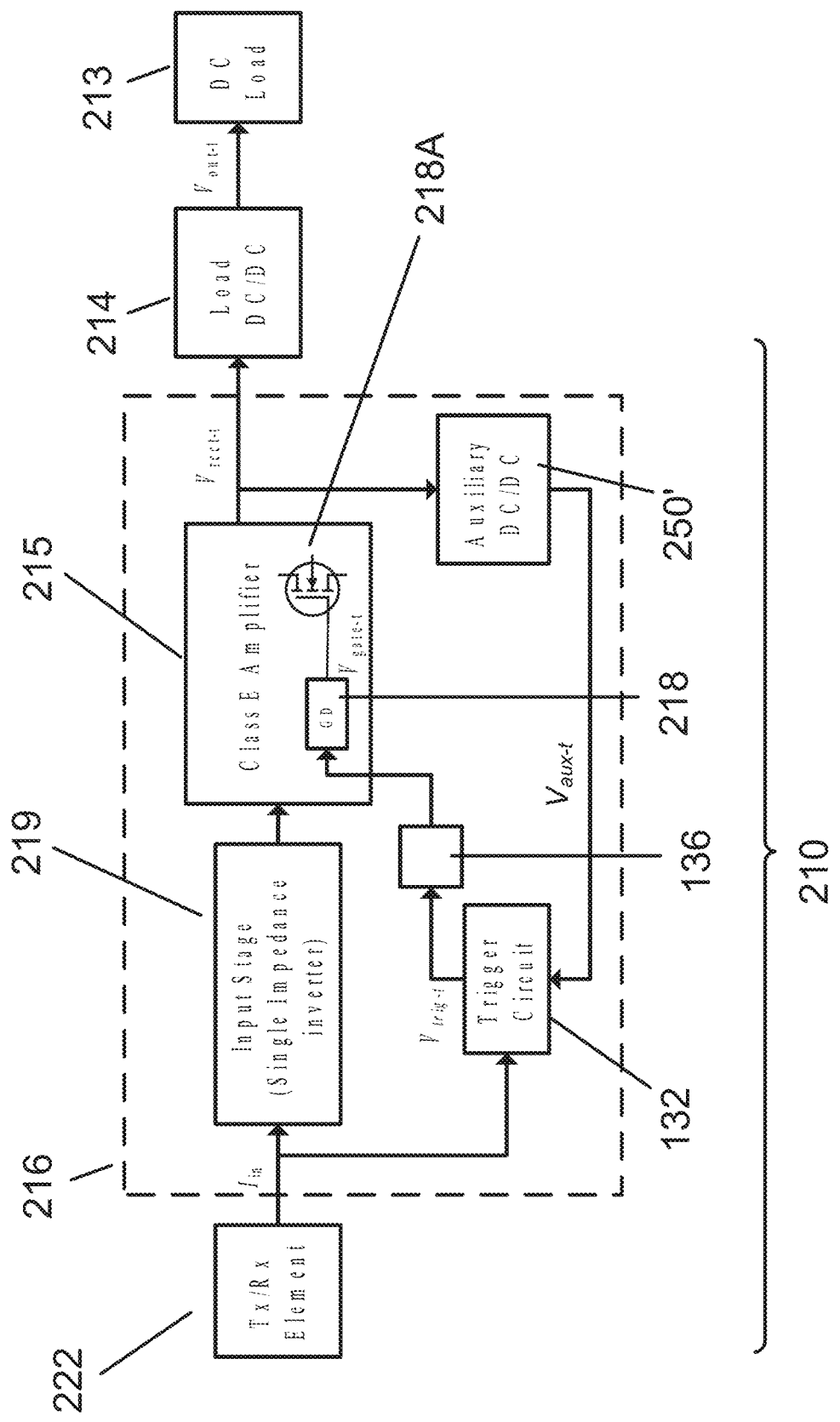
FIG. 16 is a block diagram of a portion of the wireless power transfer system of FIG. 4.

Turning now to FIG. 16, a portion of the wireless power transfer system 200 including the first bidirectional power transfer system 210 is further illustrated. The circuitry 216 is shown surrounded by dashed lines. As previously described when the first bidirectional power transfer system 210 is operating as receiver in the reverse power flow direction, the power stage 138 of the circuitry 216 is for rectifying a received power signal. The switching element 136 electrically connects the power stage 138 to the trigger circuit 132.

As previously described, the circuitry 216 comprises power stage 138 comprising an amplifier 215 and a matching network or circuit, which takes the form of a single stage impedance inverter 219. The circuitry 216 further comprises a trigger circuit 132 electrically connected to gate driver 218 of the amplifier 215 via a switching element 136. The circuitry 216 further comprises an auxiliary DC/DC converter 250' electrically connected to the trigger circuit 132.

As previously stated, the amplifier 215 is a class E amplifier. The amplifier 215 comprises the gate driver 218 and the main switch, which takes the form of a MOSFET 218A.

In general, in a class E amplifier the performance of the rectifier is optimized for a specified output load, i.e. a desired load. During operation as the output load varies from the desired load, the amplifier DC voltage varies substantially. Furthermore, when the output load varies from the desired load, the zero-voltage-switching (ZVS) operation of the main switch (MOSFET 218A) of the amplifier 215 becomes compromised and, consequently, operation becomes unstable. In contrast, a load-independent class E amplifier retains the ZVS operation of switches of the amplifier 215 from a no load condition, i.e. zero load, to a full load condition. In addition, the rectified voltage is relatively constant between the no load and full load conditions. The switching losses from the no load condition to the full load condition are approximately constant and performance remains stable.

The class E amplifier design is adapted for converting the input RF power to DC. The operating or switching frequencies of the amplifier 215 may be, for example, 6.78 MHz, 13.56 MHz, and 27.12 MHz. The voltage output by the amplifier 215 is $V_{rect-r}$. The RF current input into the single stage impedance inverter 219 is $I_{in}$. In this embodiment, the DC voltage, $V_{rect-r}$, is unregulated. As the amplifier 215 comprises a load-independent amplifier, the switch-node waveform does not vary significantly with load as previously described. Thus, the voltage is relatively stable.

The auxiliary DC/DC converter 250' is for converting the $V_{rect-r}$ output by the amplifier 215 to an auxiliary voltage range, e.g. in the range of 5V, $V_{aux-r}$, to power the trigger circuit 132. The auxiliary signal $V_{aux-r}$ powers the trigger circuit 132. Until the auxiliary DC/DC converter 250' can regulate, the MOSFET 218A is off and the amplifier 215 acts as a passive (diode) rectifier. In this embodiment, the auxiliary DC/DC converter 250' comprises a low-power buck converter.

The trigger circuit 132 is powered by a signal, e.g. $V_{aux-r}$, from the auxiliary DC/DC converter 250'. The trigger circuit 132 samples the RF power input $I_{in}$ outputted by the transceiver element 222 and produces an appropriately timed trigger voltage $V_{trig-r}$. The trigger voltage or signal $V_{trig-r}$ is timed such that a gate drive voltage or gate signal $V_{gate-r}$ output by the gate driver 218 is 90-degrees out of phase with the input current $I_{in}$. The trigger circuit 132 is for ensuring proper timing of the gate drive voltage or gate signal $V_{gate-r}$ output by the gate driver 218. As will be described, the trigger circuit 132 is configured to provide a trigger signal $V_{trig-r}$ that recovers timing using the input current $I_{in}$. In the illustrated arrangement, the trigger signal $V_{trig-r}$ comprises a pulse signal.

Ideally the main switch (MOSFET 218A) of the amplifier 215 is open when the incoming current is positive and closed when the incoming current is negative, resulting in proper rectification. Assuming perfect tuning, $V_{gate-r}$ should be 90-degrees out of phase with $I_{in}$.

The gate driver 218 outputs a signal to switch the MOSFET 218A. In particular, the gate driver 218 outputs a gate drive voltage or gate signal, $V_{gate-r}$, to control operation of the amplifier 215, e.g. control switching of the MOSFET 218A of the amplifier 215.

In this embodiment, the gate drive voltage $V_{gate-r}$ is a delayed and more powerful reproduction of the trigger voltage $V_{trig-r}$ input into the gate driver 218.

The gate driver 218 and the trigger circuit 132 exhibit non-negligible propagation delays. To address the challenge of the non-negligible propagation delays from the gate driver 218 and the trigger circuit 132, the trigger circuit 132 is designed such that the trigger circuit 132 further delays the output signal $V_{trig-r}$ to ensure $V_{gate-r}$ is synchronized with $V_{in}$.

Figure 17:
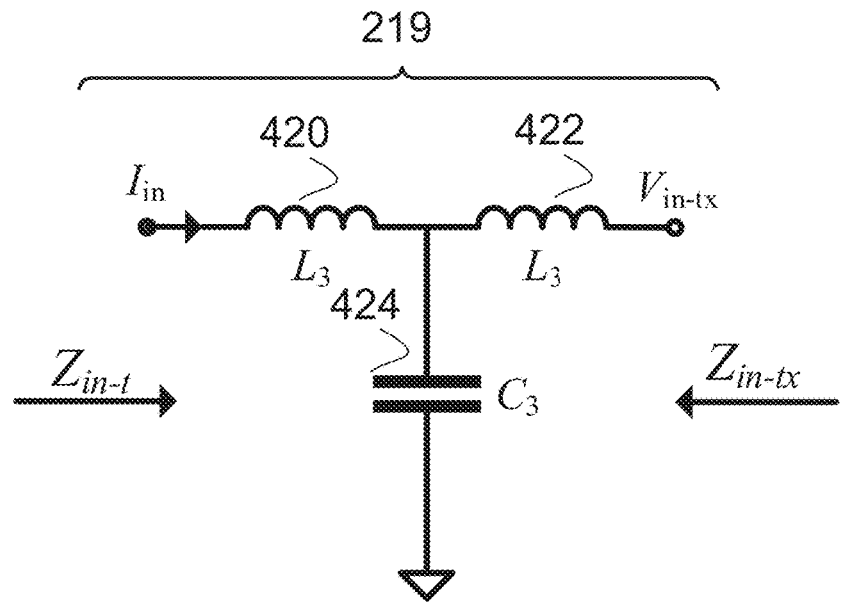
FIG. 17 is circuit diagram of a single impedance inverter of the wireless power transfer system of FIG. 16.

Turning now to FIG. 17, the single impedance inverter 219 is implemented as a single stage of an LC "T" network. The LC "T" network comprises two series connected inductors 420, 422, each having inductance $L_3$. A capacitor 424 with capacitance $C_3$ is connected in parallel between inductors 420 and 422. The inductors 420, 422 and capacitor 424 resonate at the switching frequency. The output voltage from the single impedance inverter 219 to the amplifier 215 is $V_{in-tx}$.

The input impedance of the amplifier 215 is $Z_{in-tx}$ and the impedance of the transceiver element 222, which extracts power in the reverse power flow direction, is $Z_{in-r}$. At the switching frequency, the impedances are related by Equation 12 below.

$$Z_{in-t} = (Z_{in-tx})^{-1}(X)^2 \text{ where } X = (\omega L_3) = \frac{1}{\omega C_3} \quad \text{(Equation 12)}$$

While a particular network topology has been described, one of skill in the art will appreciate that other matching network topologies are possible, such as a "Pi" or "L" networks.

Figure 18:
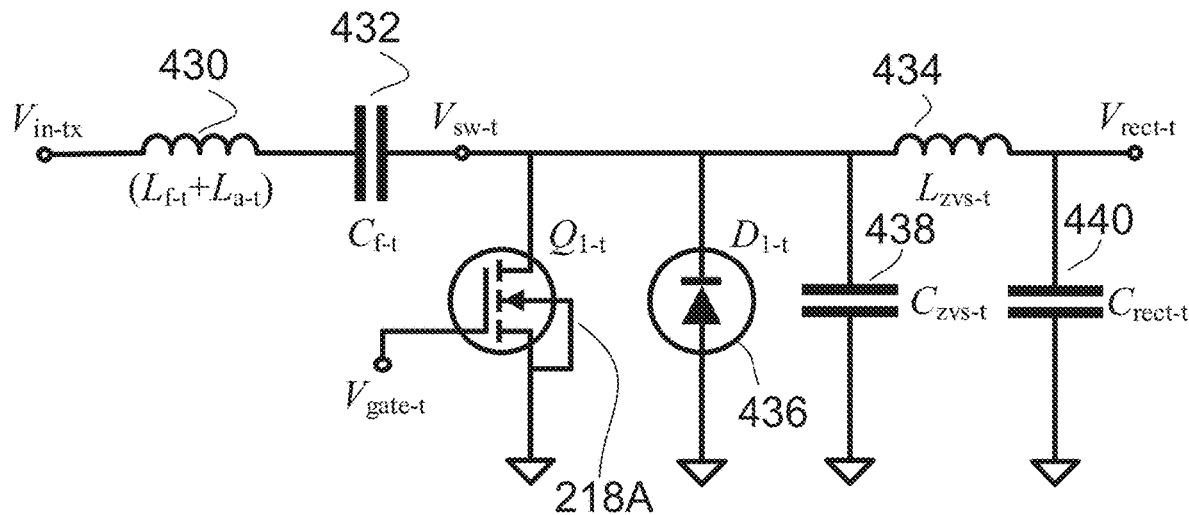
FIG. 18 is a circuit diagram of an amplifier of the wireless power transfer system of FIG. 16.

Turning now to FIG. 18, a circuit diagram of the amplifier 215 is illustrated. The amplifier 215 converts the input RF signal $V_{in-tx}$ at the switching frequency from the input stage to DC and voltage signal $V_{rect-r}$. In this embodiment, the amplifier 215 comprises a class E amplifier.

The amplifier 215 comprises an inductor 430 having an inductance $L_{f-t}+L_{a-r}$, a capacitor 432 having a capacitance $C_{f-r}$, and an inductor 434 having an inductance $L_{zvs-r}$ all connected in series. The amplifier 215 further comprises a diode 436 indicated as $D_{1-r}$, a capacitor 438 having a capacitance $C_{zvs-r}$, and a capacitor 440 having a capacitor $C_{rect-r}$. The main switch (MOSFET 218A), capacitor 438 and diode 436 are connected in parallel between the capacitor 432 and inductor 434. The capacitor 440 is between $V_{rect-r}$ and ground.

The size of components for amplifier 215 are governed by the similar equations that have already been explained with reference to Equations 4 and 5.

As with trigger circuit 132' when operating in the forward power flow direction, the trigger circuit 132 is configured to synchronizing synchronize wireless power transfer when operating in the reverse power flow direction. The trigger circuit 132 controls operation of the power stage gate driver 218 and therefore the amplifier 215 to synchronize operation of the amplifier 215 with the power signal being received by the transceiver element 222.

Timing recovery is required to ensure proper switching of the MOSFET 218A. Ideally, the MOSFET 218A is in the open position when the incoming current is positive and closed when the incoming current is negative, resulting in rectification. Assuming all the input stage 219 is perfectly tuned, this means $V_{gate-t}$ should be 90-degrees out of phase with $I_n$. To achieve this, the trigger circuit 132 samples $I_{in}$, and produces an appropriately timed trigger voltage $V_{trig-t}$, for the gate driver 218.

Both the gate driver 218 and the trigger circuit 132 exhibit non-negligible propagation delays. To address these non-negligible propagation delays, the trigger circuit 132 is designed such that it further delays the signal until $V_{gate-t}$ is synchronized with $I_{in}$.

Thus, the trigger circuit 132 is a "TX time recovery trigger circuit". The trigger circuit 132 operates to achieve synchronous rectification in the reverse power flow direction.

Figure 19:
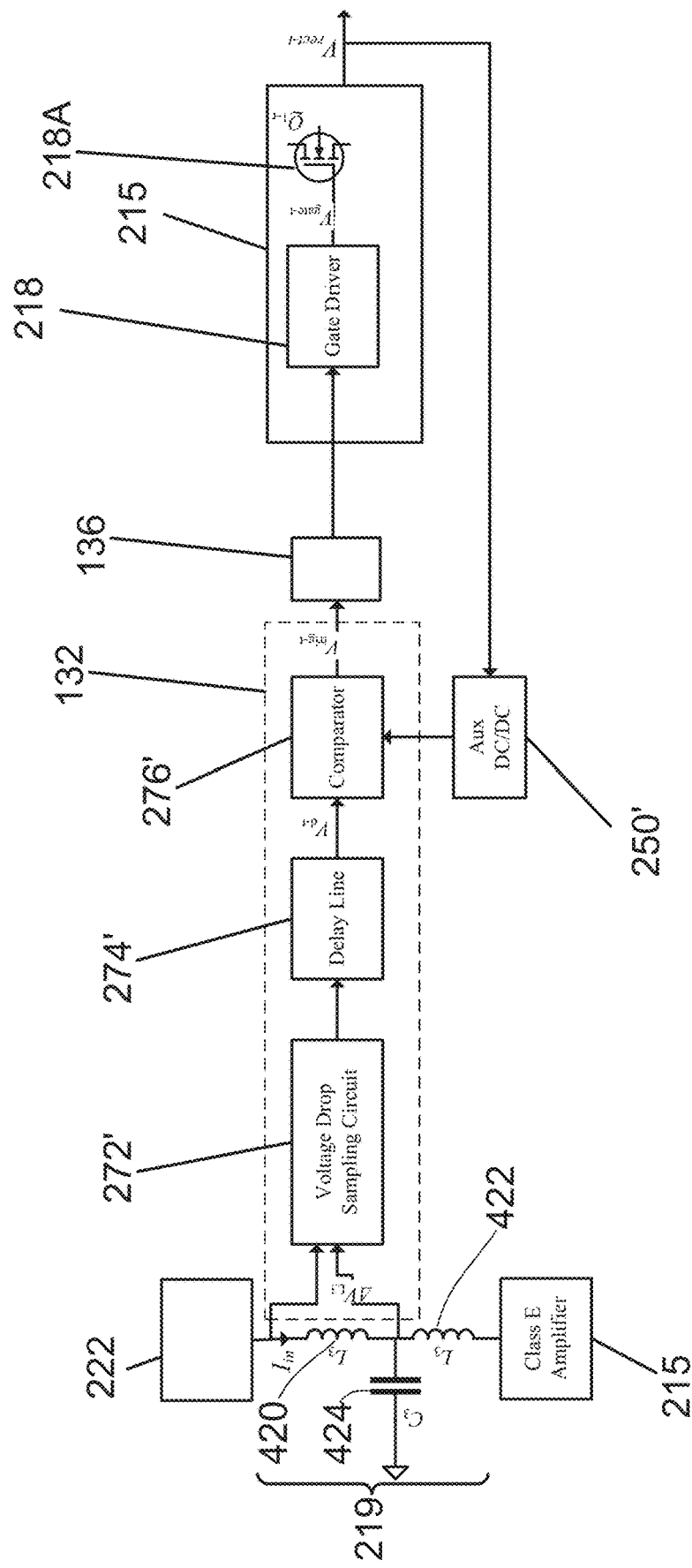
FIG. 19 is a block diagram of a transceiver element, impedance inverter, trigger circuit, switching element, auxiliary DC/DC converter, and amplifier of the wireless power transfer system of FIG. 16.

Turning now to FIG. 19, a block diagram of the transceiver element 222, impedance inverter 219 (comprising inductors 420, 422, and capacitor 424), trigger circuit 132, switching element 136, auxiliary DC/DC converter 250', and amplifier 215 is illustrated. The trigger circuit 132 is outlined in dashed lines.

The gate driver 218 of the amplifier 215 produces the appropriate waveform to switch the MOSFET 218A on or off. The associated gate drive voltage, $V_{gate-t}$, is essentially a delayed and more powerful reproduction of the input trigger voltage, $V_{trig-t}$.

As previously stated, the auxiliary DC/DC converter 250' powers the trigger circuit 132.

The trigger circuit 132 comprises a sampling circuit 272', a delay line 274', and a comparator circuit 276'. The trigger circuit 132 samples a voltage across the inductor 420 of the impedance inverter 219. In particular, the sampling circuit 272' is a voltage drop sampling circuit. The voltage drop across the inductor 420 of the impedance inverter 219 is sampled via sampling circuit 272' and fed to a lumped element delay line circuit 274'. The delay line 274' comprises a lumped element delay circuit. The comparator 276' is then used to generate a clock signal by comparing the delayed signal $V_{d-t}$ to a DC level. The resulting trigger voltage $V_{trig-t}$ is fed to the gate driver 218 via the switching element 136. The gate driver 218 converts trigger voltage $V_{trig-t}$ to a suitable waveform $V_{gate-t}$ for driving the MOSFET 218A.

The sampling circuit 272', delay line circuit 274', and comparator circuit 276' are all designed to ensure that voltage $V_{gate-t}$ is 90-degrees out of phase with the inductor 420 current $I_{in}$ or in phase with the voltage difference, $\Delta V_{L3}$ across the inductor 420.

Figure 20:
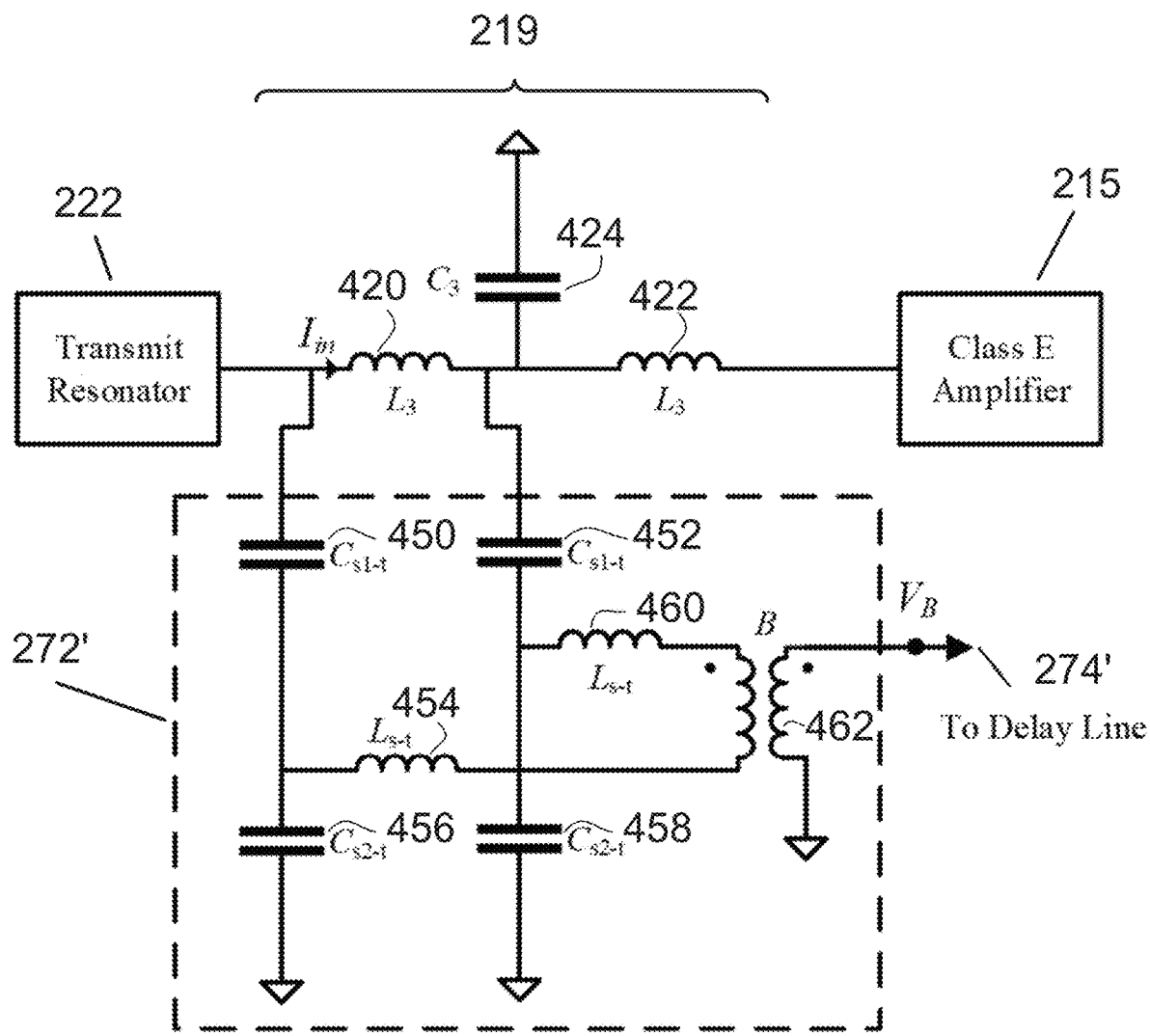
FIG. 20 is a circuit diagram of a transceiver element, amplifier, impedance inverter, and a portion of the trigger circuit of FIG. 19.

Turning now to FIG. 20, the transceiver element 222, single stage impedance inverter 219 (comprising inductors 420, 422, and capacitor 424), sampling circuit 272', and amplifier 215 are illustrated. The sampling circuit 272' is shown in dashed lines. The sampling circuit 272' is a voltage drop sampling circuit.

The single stage impedance inverter 219 is connected between the transceiver element 222 and the amplifier 215. Input current $I_{in}$ (output current from the transceiver element 222) flows through the inductor 420 of the impedance inverter 219.

The current $I_{in}$ may be difficult to sample. Further, the phase of the current $I_{in}$ may be difficult to track in order to use as a source signal to generate the trigger signal by the trigger circuit 132. As such the voltage drop across the inductor 420 of the single stage impedance inverter 219 may be used. This signal can be used as the source signal to generate the trigger signal of the MOSFET 241 of the circuitry 224. The relation between voltage-drop across an inductor and the current through that inductor is given by Equation 13 below:

$$v_L = j\omega L \times I_L \qquad \text{(Equation 13)}$$

If the voltage drop across the inductor 420 in the impedance inverter 219 is used as the source signal to generate the trigger signal, the generated trigger will in phase with the voltage drop across the inductor 420. One of skill in the art will recognize that other methods of sampling and tracking the phase of the current $I_{in}$ may be used.

The sampling circuit 272' scales down the voltage drop across the inductor 420. The sampling circuit 272' comprises a capacitive divider network comprising capacitors 450, 452 each with capacitance $C_{s1-t}$, and capacitors 456, 458 each with capacitance $C_{s2-t}$. Capacitors 450, 452 are connected to each side of the inductor 240, and capacitors 456, 458 are connected between capacitors 450 and 452, respectively, and to ground. Capacitors 450, 456 are in series, and capacitors 452, 458 are in series. Inductors 454, 460 each with inductance $L_{s-t}$ are positioned to compensate the $C_{s2-t}$. Each inductor 454, 460 is connected intermediate a capacitor pair 450, 456 and 452, 458, respectively. The inductors 454, 460 provide the input to a balun 462 which has an output voltage $V_B$. In the illustrated arrangement, the balun 462 is an unbalanced-to-unbalanced balun; however, the balun 462 may be unbalanced-to-balanced.

Ideally the output voltage $V_B$ of the balun 462 is in-phase with the voltage drop across the inductor 420. However, there may be a delay which may be difficult to predict beforehand. Delay may be caused by PCB (printed circuit board) traces or by the balun 462.

The ratio of the capacitor divider network and the turn ratio of the balun 462 determines the magnitude of $V_B$. The coupling ratio between the elements 222, 229 is also considered in order to determine capacitances $C_{s1-t}$ and $C_{s2-t}$.

Figure 21:
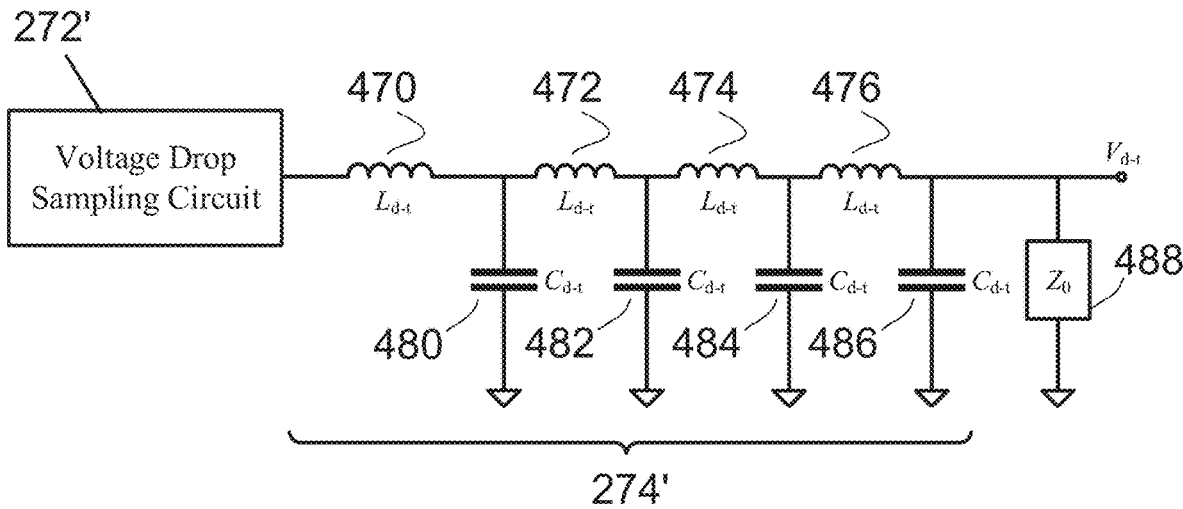
FIG. 21 is a circuit diagram of a portion of the trigger circuit of FIG. 19.

The scaled down sampled voltage is fed to the delay line 274' as shown in FIG. 20. The delay line 274' is shown in FIG. 21. The delay line 274' functions in the same manner as the delay line 274 of the second bidirectional power transfer system 220.

In this embodiment, the delay line 274' is implemented as a multiple-stage lumped-element transmission line circuit. Each lumped-element comprises LC elements. In the illustrated arrangement, the lumped-element transmission line circuit comprises four (4) lumped-element stages divided evenly along the line circuit. Although FIG. 21 illustrates an evenly split delay line 274', the components in each stage do not necessarily need to be identical and the number of stages can be less or more than four.

While a particular lumped element of passive inductors and capacitors has been described for the delay line 274', one of skill in the art will appreciate that other configurations of delay circuits are possible, such as integrated analog or digital delay circuits.

In the illustrated arrangement, the lumped-element transmission line circuit comprises four (4) inductors 470, 472, 474, 476 arranged in series, and four (4) capacitors 480, 482, 484, 486 arranged in parallel between the inductors 470, 472, 474, 476 and resistor 488 having a resistance value $Z_0$. The total inductance and capacitance associated with the delay line 274', denoted by $L_{dt}$ and $C_{dt}$, respectively, are divided among the inductors 470, 472, 474, 476 and capacitors 480, 482, 484, 486 (the $L_{d-t}$ and $C_{d-t}$ components).

The time delay, and parameters of the delay line 274', $L_{dt}$ and $C_{dt}$, are given by Equations 6 to 8 previously discussed.

Figure 22:
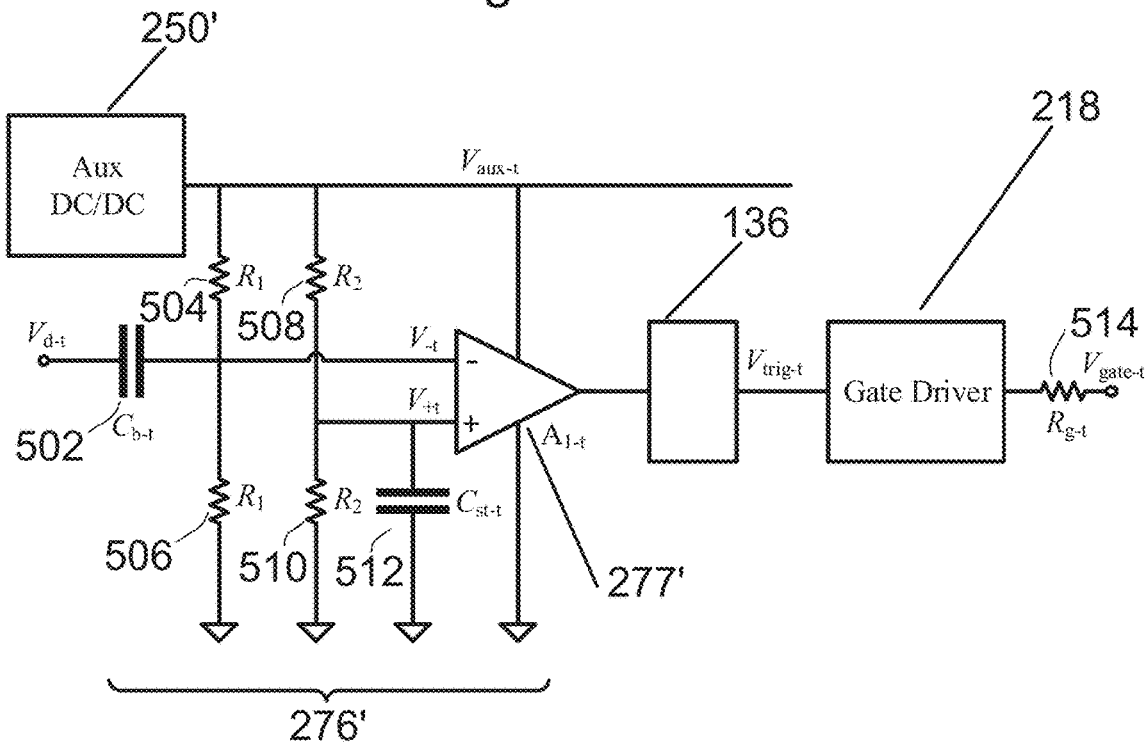
FIG. 22 is a circuit diagram of a portion of the trigger circuit, switching element, and auxiliary DC/DC converter of FIG. 19.

The delayed voltage signal $V_{d-t}$ is then fed to comparator circuit 276' illustrated in FIG. 22. The comparator circuit 276' is for generating a clock signal by comparing the delayed signal $V_{d-t}$ output by the delay line 274' to a DC signal. As shown in FIG. 22, the comparator circuit 276' comprises a comparator 277' ($A_{1-t}$), which is powered from the auxiliary DC/DC converter 250' having an auxiliary supply voltage $V_{aux-t}$. The comparator circuit 276' is the same as the comparator circuit 276 illustrated in FIG. 13.

The inputs of the comparator 277' are biased to roughly half of $V_{aux-t}$. For the positive comparator input $V_{+t}$ this is achieved using two equal-valued resistors 508, 510, each with resistance of $R_2$.

The negative comparator input $V_{-t}$ this is achieved using two equal-valued resistors 504, 506, each with resistance of $R_1$.

The delayed voltage signal $V_{d-t}$ output by the delay line 274' is coupled to the negative comparator input $V_{-t}$ via DC blocking capacitor 502 having capacitance $C_{b-t}$ thus the trigger voltage $V_{trig-t}$ will be inverted (180° out-of-phase) relative to the delayed voltage signal $V_{d-t}$.

The output of the gate driver 218' is connected to a resistor 514 having resistance $R_{g-t}$ to provide the gate signal $V_{gate-t}$ to the MOSFET 218A.

As previously stated, when operating in the reverse power flow direction, the second bidirectional power transfer system 220 operates as a transmitter. The power supply 227 outputs a voltage, which is converted by the DC/DC converter 226 to the necessary level. The circuitry 224 receives the converted voltage. The gate driver 260 of the amplifier 240 drives the main switch (MOSFET 241) of the amplifier 240 under the control of the clock signal generated by the clock generator 134' to invert the inputted power signal (the converted voltage). The double stage impedance inverter 231 receives this signal to output a voltage which is load independent. The impedance inverter 231 drives the second transceiver element 229 to transfer power via wireless coupling (electric and/or magnetic field coupling) to the first transceiver element 222 of the first bidirectional power transfer system 210.

When operating in the reverse power flow direction, the first bidirectional power transfer system 210 operates as a receiver. The received input current $I_{in}$ at the first transceiver element 222 used by to the trigger circuit 132 and the circuitry 216 of the first bidirectional power transfer system 210. The single stage impedance inverter 219 of the circuitry 216 receives the input current $I_{in}$ and matches the current to the optimum impedance of the circuitry 216. The trigger circuit 132 controls operation of the gate driver 218 of the amplifier 215 via the switching element 136. Specifically, the trigger circuit 132 samples a voltage drop, and produces an appropriately timed trigger voltage $V_{trig-t}$ for the gate driver 218. The gate driver 218 outputs a gate drive voltage or gate signal, $V_{gate-t}$, to control operation of the amplifier 215, e.g. control switching of the MOSFET 218A of the amplifier 215, based on the received trigger voltage $V_{trig-t}$ from the trigger circuit 132. The amplifier 215 then outputs a DC voltage $V_{rect-t}$. The DC/DC converter 214 converts the DC voltage $V_{rect-t}$ to a desired $V_{out-t}$ for the load 213. The DC voltage $V_{rect-t}$ is also used by the auxiliary DC/DC converter 250' to power the trigger circuit 132.

Figure 23A:
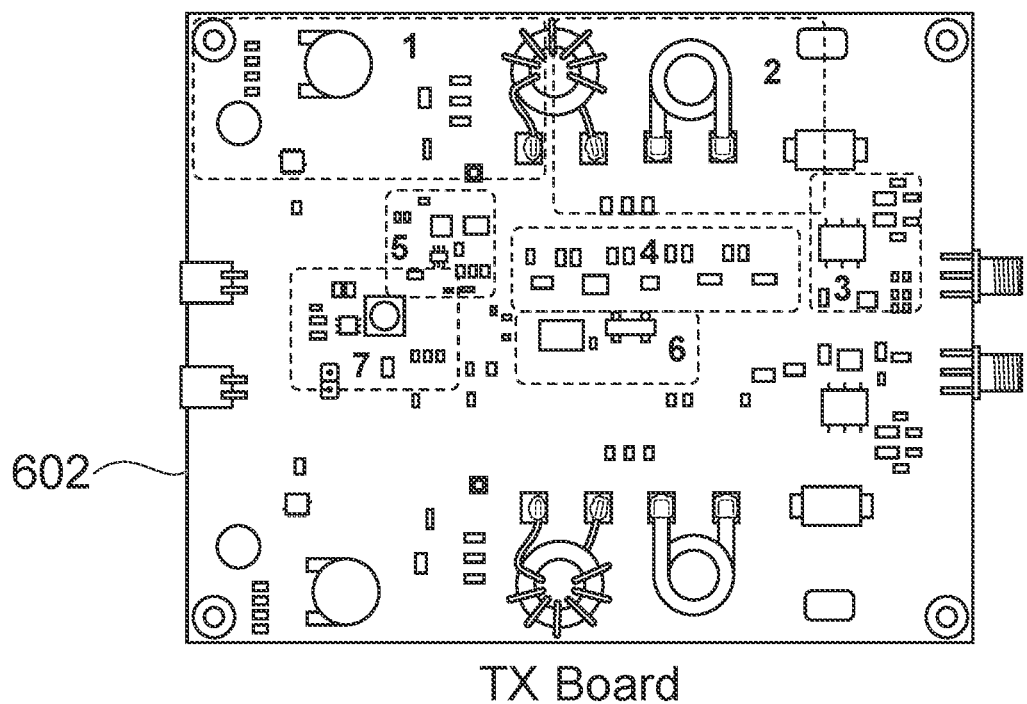
FIG. 23A is a plan view of a portion of a bidirectional wireless power transfer system in accordance with an aspect of the subject disclosure.

An experimental wireless power transfer system 200 was produced to test performance of the system 200. Turning now to FIG. 23A, a PCB 602 which includes a portion of the first bidirectional power transfer system 210 is shown. The PCB 602 comprises electrical components forming the amplifier 215 in area 1, the single stage impedance inverter 219 in area 2, the sampling circuit 272' in area 3, the delay line 274' in area 4, the comparator circuit 276', the switching element 136, the gate driver 218 in area 5, the clock generator 134 in area 6, and the auxiliary DC/DC converter 250' in area 7.

Figure 23B:
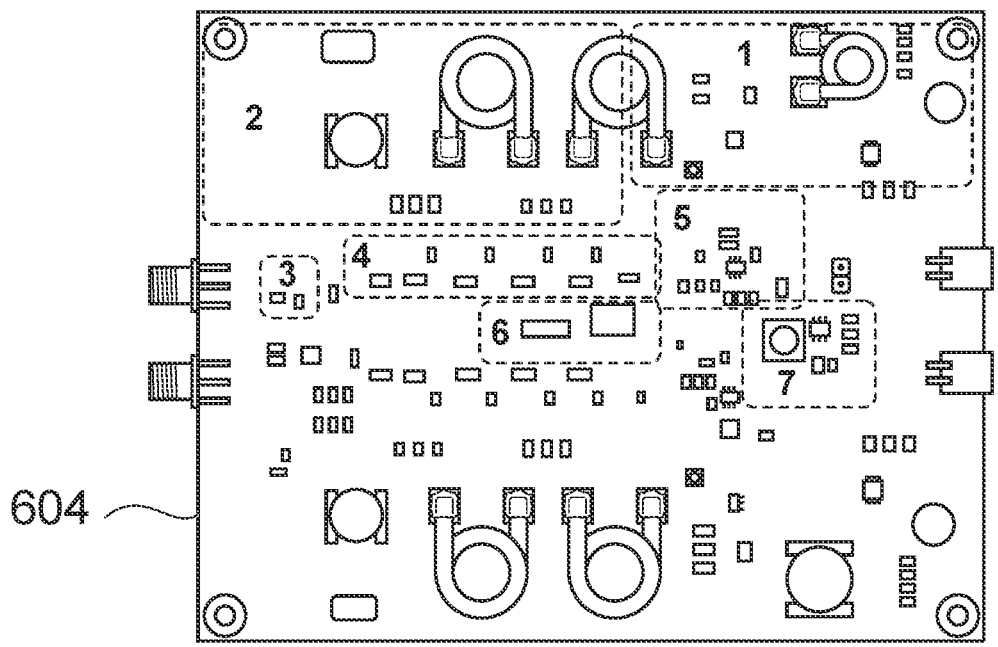
FIG. 23B is a plan view of a portion of another bidirectional wireless power transfer system in accordance with an aspect of the subject disclosure.

Turning now to FIG. 23B, a PCB 604 which includes a portion of the second bidirectional power transfer system 220 is shown. The PCB 604 comprises electrical components forming the amplifier 240 in area 1, the double stage impedance inverter 231 in area 2, the sampling circuit 272 in area 3, the delay line 274 in area 4, the comparator circuit 276, the switching element 136', and the gate driver 260 in area 5, the clock generator 134' in area 6, and the auxiliary DC/DC converter 250 in area 7.

Testing of the systems 210, 220 was performed at a switching frequency of 27.12 MHz switching frequency with 100 Ω capacitive electrodes as transceiver elements 222, 229 using the PCBs illustrated in FIGS. 23A, 23B. Solenoidal air core inductors were used to establish resonance behaviour at the transceiver elements 222, 229.

The circuitries 216, 224 were designed for 40 W power out in order to deliver 35 W to the DC load 228, 213, which is an electronic DC load in the forward and reverse power flow directions, respectively.

The switching element 136, 136' of the systems 210, 220 was operated to connect the respective power stages 138, 138' to the clock generator 134, 134' for inverting an inputted power signal, or to the trigger circuit 132, 132' for rectifying a received power signal.

When operating in the forward power flow direction, the DC/DC converter 214 connected to PCB 602 of the first system 210 and power supply 212 was supplied with a 24 DC power supply, and the DC/DC converter 226 connected to the PCB 604 of the second system 220 outputted a regulated 24V to the electronic load (DC load 228).

Figure 24A:
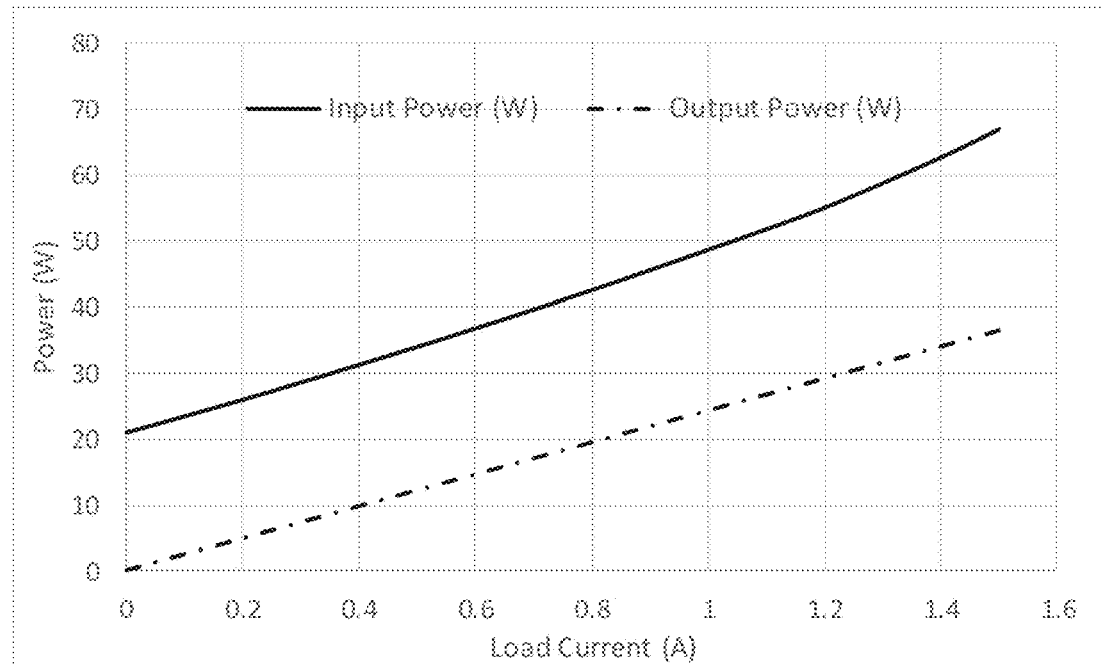
FIG. 24A is a graph of the input power and output power relative to load current for a wireless power transfer system operating in the forward power flow direction in accordance with an aspect of the subject disclosure.
Figure 24B:
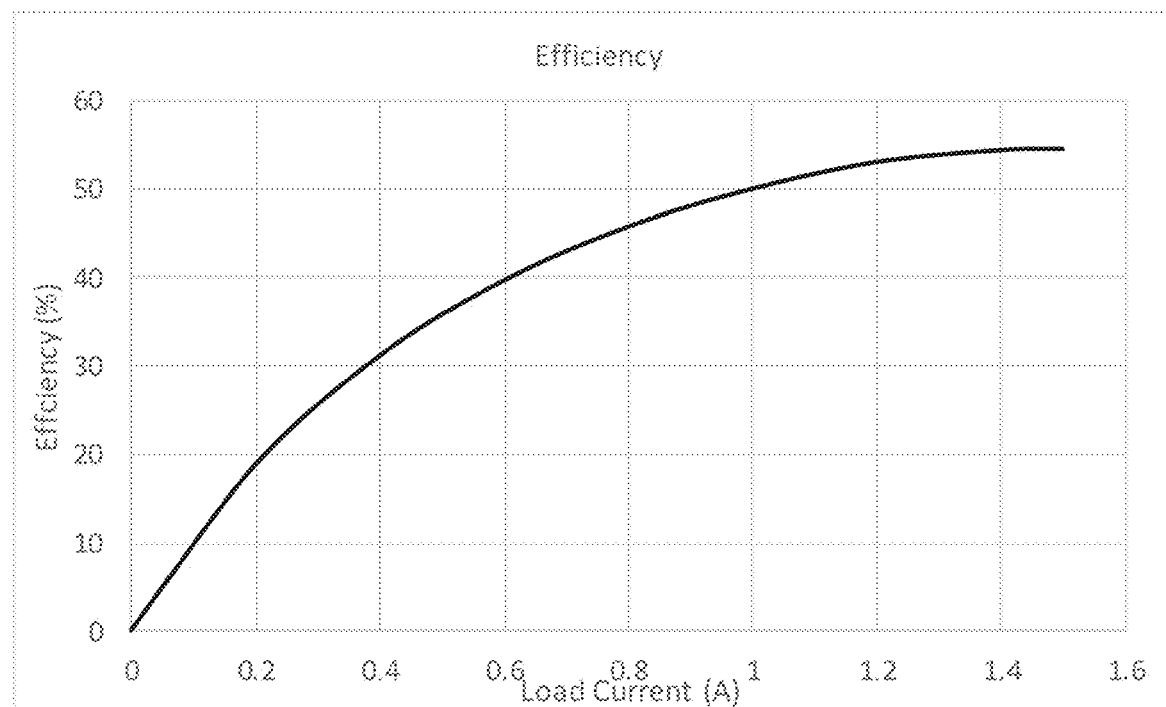
FIG. 24B is a graph of power transfer efficiency relative to load current for a wireless power transfer system operating in the forward power flow direction in accordance with an aspect of the subject disclosure.
Figure 24C:
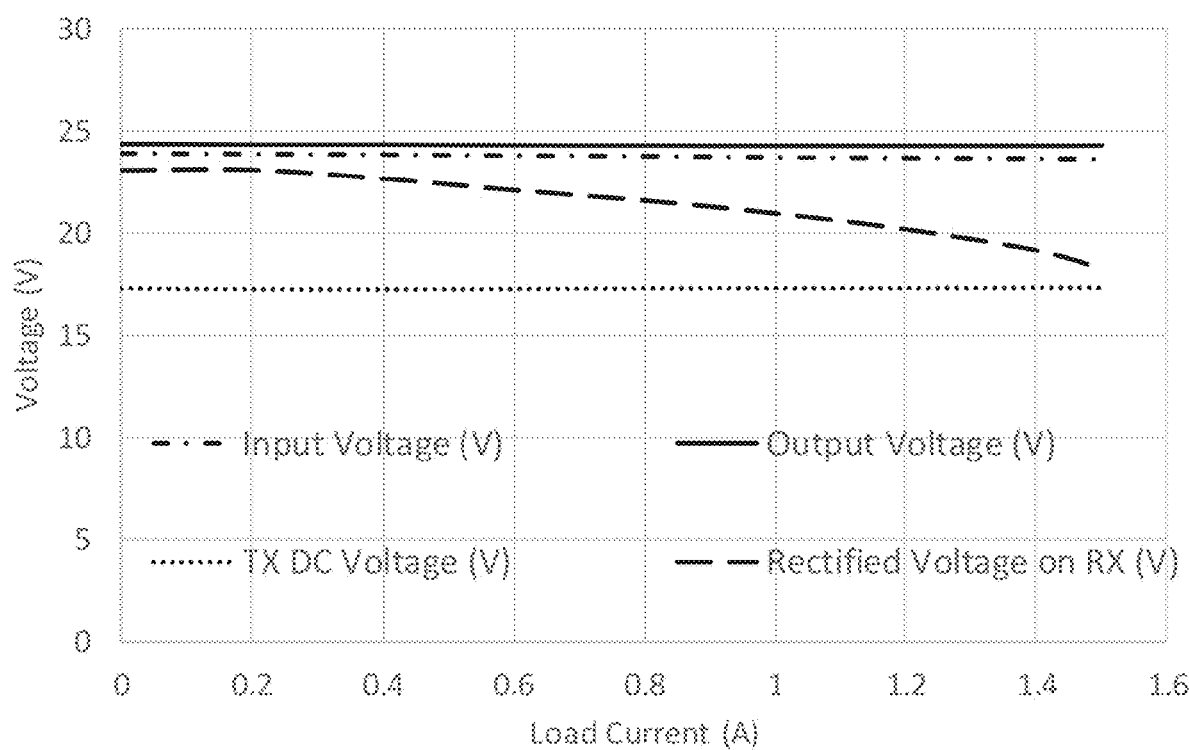
FIG. 24C is a graph of voltages relative to load current for a wireless power transfer system operating in the forward power flow direction in accordance with an aspect of the subject disclosure.

Turning now to FIGS. 24A to 24C, various graphs depicting operation in the forward power flow direction are shown. FIG. 24A depicts the input power of the power supply 212, and output power delivered to the load 228 relative to the load current when the experimental wireless power transfer system is operated in the forward power flow direction. As shown in FIG. 24A, at no output load (DC load 228), roughly 21 W are required to energize the wireless power transfer system. The nominal output power of 36.48 W is achieved when the load current is 1.5 A.

FIG. 24B depicts the end-to-end power transfer efficiency for the experimental system relative to the load current. The power transfer efficiency is obtained by dividing the output and input powers shown in FIG. 24A. The peak power transfer efficiency is roughly 55% at 1.5 A.

FIG. 24C depicts the voltage stability of the experimental system. In particular, the input voltage at the power supply 212 (input voltage), output voltage ($V_{out-r}$) at the DC/DC converter 226 (output voltage), output voltage at the DC/DC converter 214 (TX DC voltage), and rectified voltage ($V_{rect-r}$) relative to the load current (rectified voltage on RX) are depicted.

The input voltage at the power supply 212, and output voltage ($V_{out-r}$) are generally stable through the current range with voltages of approximately 24 V. The input voltage at the DC/DC converter 214 is approximately 17.2 V. Thus, the DC/DC converter 214 converts the input voltage from 24 V to 17.2 V. The rectified voltage ($V_{rect-r}$) is approximately 23.6 V at no-load (0 A), and decreases to approximately 18.3 V at 1.5 A load current. This voltage is converted to 24 V by the DC/DC converter 226 connected to load 228.

Figure 25A:
FIG. 25A is a graph of switch node voltages of a wireless power transfer system at a no-load condition operating in the forward power flow direction in accordance with an aspect of the subject disclosure.
Figure 25B:
FIG. 25B is a graph of switch node voltages of a wireless power transfer system at a full load condition operating in the forward power flow direction in accordance with an aspect of the subject disclosure.

FIGS. 25A and 25B are graphs of switch node voltages of the amplifier 240 on the PCB 604 at no-load and full load conditions, respectively.

When operating in the reverse power flow direction, the DC/DC converter 226 connected to PCB 604 of the second system 220 and power supply 227 was supplied with a 24 DC power supply, and the DC/DC converter 214 connected to the PCB 602 of the first system 210 outputted a regulated 24V to the electronic load (DC load 213).

Figure 26A:
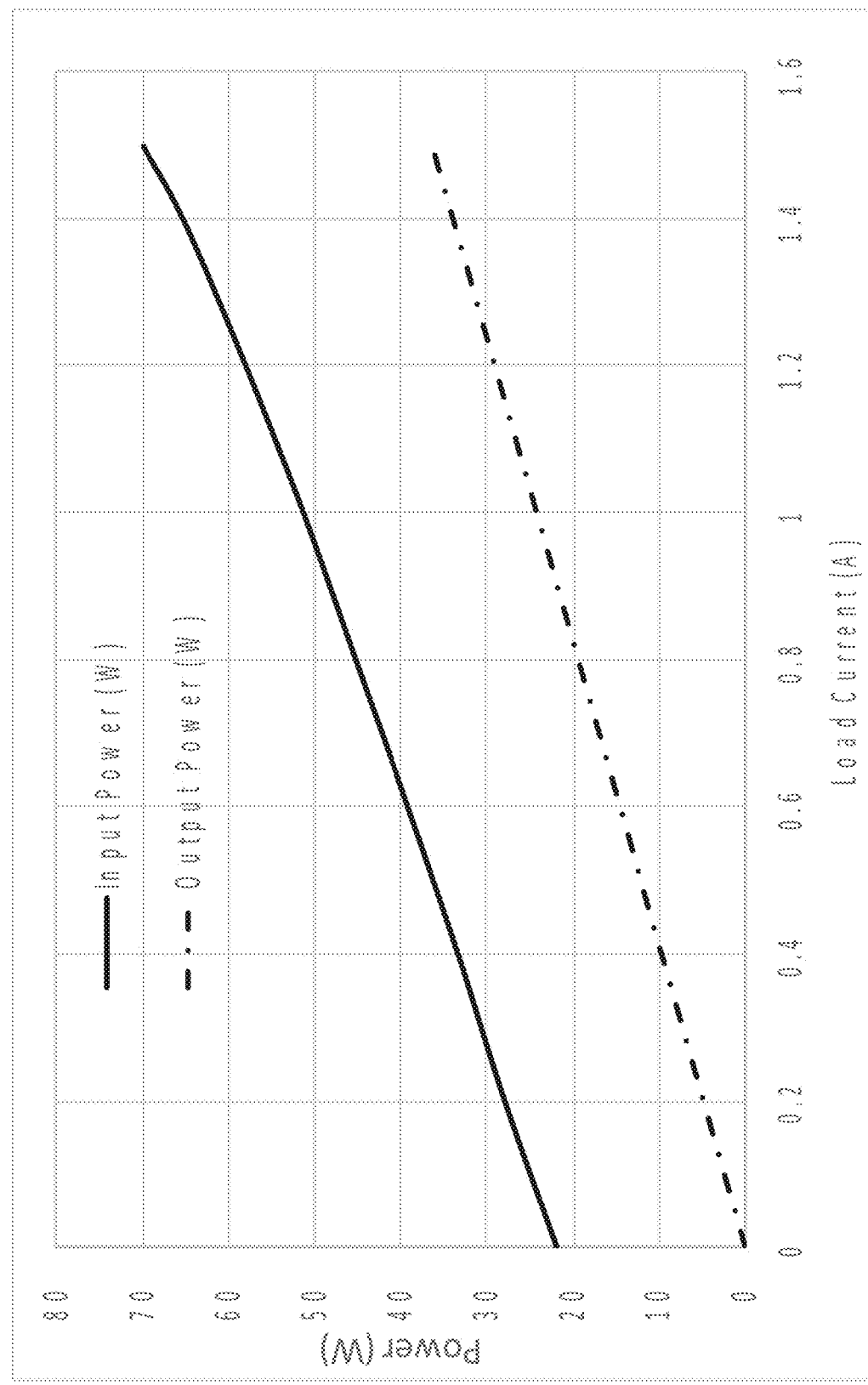
FIG. 26A is a graph of the input power and output power relative to load current for a wireless power transfer system operating in the reverse power flow direction in accordance with an aspect of the subject disclosure.
Figure 26B:
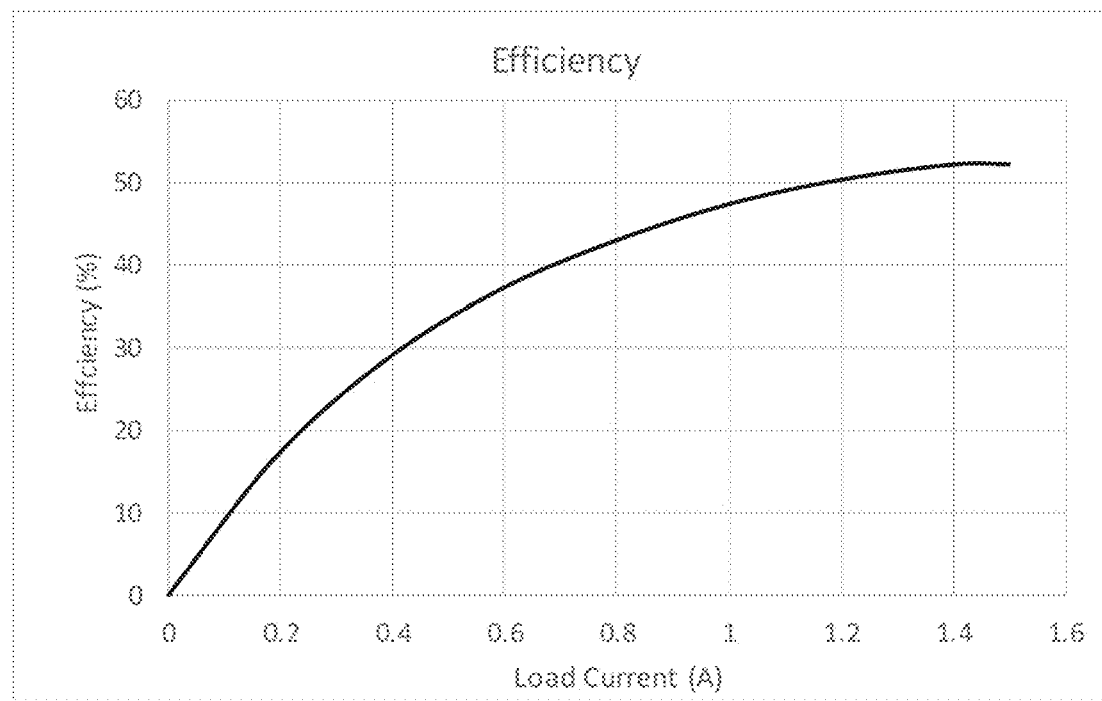
FIG. 26B is a graph of power transfer efficiency relative to load current for a wireless power transfer system operating in the reverse power flow direction in accordance with an aspect of the subject disclosure.
Figure 26C:
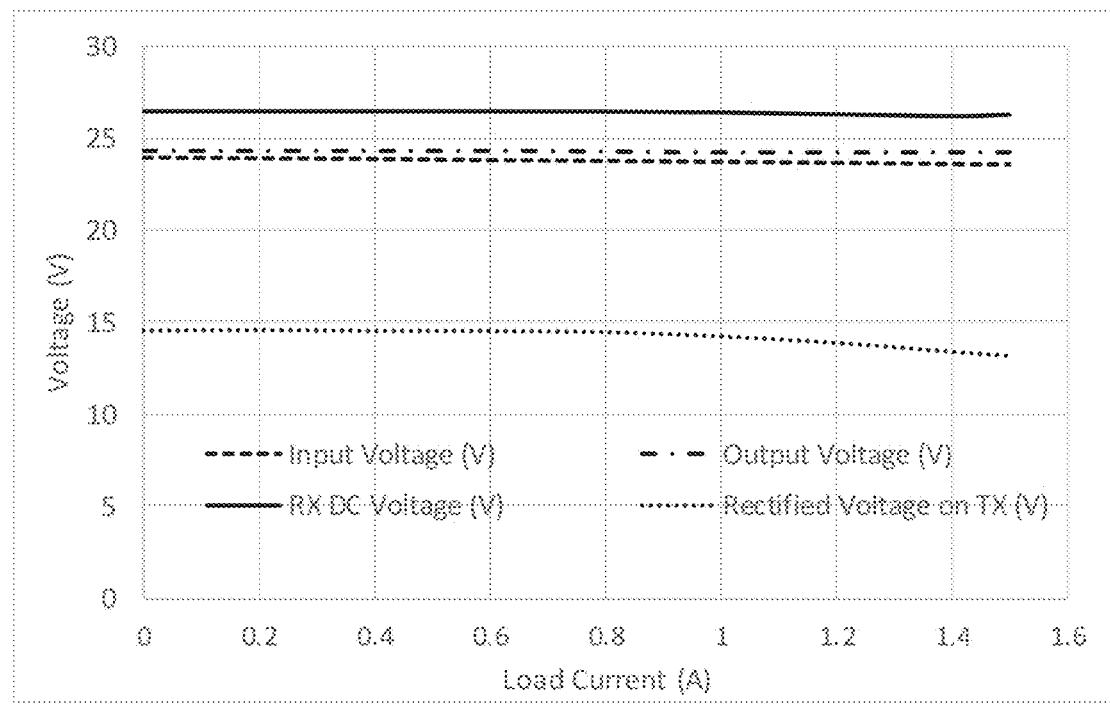
FIG. 26C is a graph of voltages relative to load current for a wireless power transfer system operating in the reverse power flow direction in accordance with an aspect of the subject disclosure.

Turning now to FIGS. 26A to 26C various graphs depicting operation in the reverse power flow direction are shown. FIG. 26A depicts the input power of the power supply 227 and output power delivered to the load 213 relative to the load current when the experimental wireless power transfer system is operated in the forward power flow direction. As shown in FIG. 26A, at no output load (DC load 213), roughly 22 W are required to energize the wireless power transfer system. The nominal output power of 36.4 W is achieved when the load current is 1.5 A.

FIG. 26B depicts the end-to-end power transfer efficiency for the experimental system relative to the load current. The power transfer efficiency is obtained by dividing the output and input powers shown in FIG. 26A. The peak power transfer efficiency is roughly 52% at 1.5 A.

FIG. 26C depicts the voltage stability of the experimental system. In particular, the input voltage at the power supply 227 (input voltage), output voltage ($V_{out-t}$) at the DC/DC converter (output voltage, output voltage at the DC/DC converter 226 (RX DC voltage), and rectified voltage ($V_{rect-t}$) relative to the load current (rectified voltage on TX) are depicted.

The input voltage at the power supply 227, and output voltage ($V_{out-t}$) are generally stable through the current range with voltages of approximately 24 V. The output voltage at the DC/DC converter 226 is approximately 26.4 V. Thus, the DC/DC converter 226 converts the input voltage from 24 V to 26.4 V. The rectified voltage ($V_{rect-t}$) is approximately 14.56 V at no-load (0 A), and decreases to approximately 13.2 V at 1.5 A load current. This voltage is converted to 24 V by the DC/DC converter 214 connected to load 213.

Figure 27A:
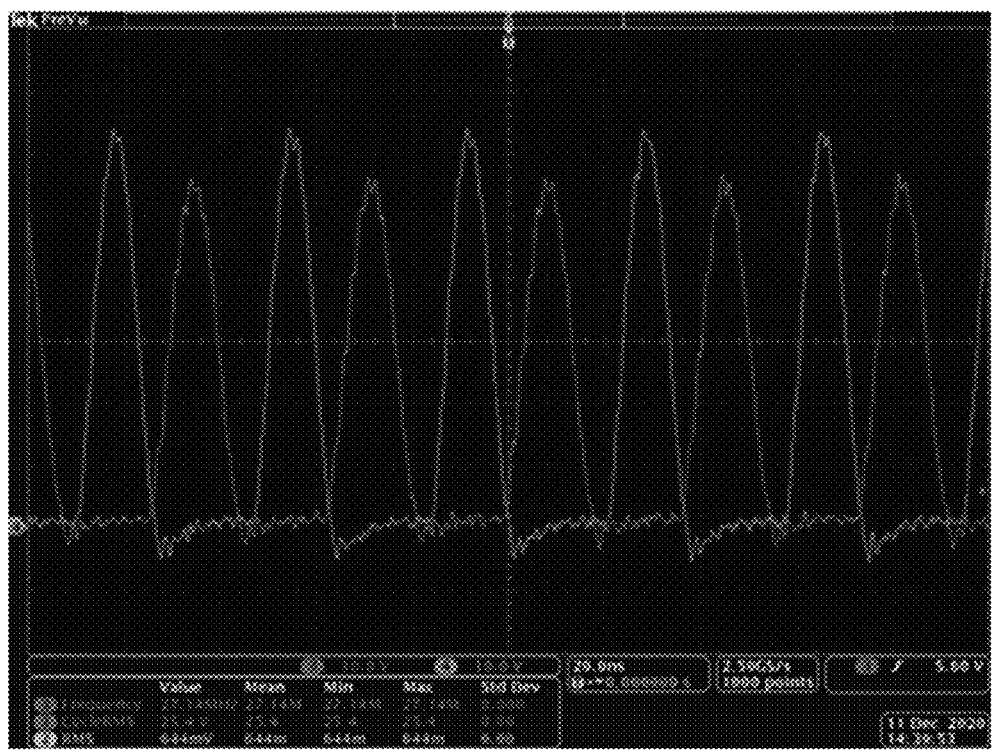
FIG. 27A is a graph of switch node voltages of a wireless power transfer system at a no-load condition operating in the reverse power flow direction in accordance with an aspect of the subject disclosure.
Figure 27B:
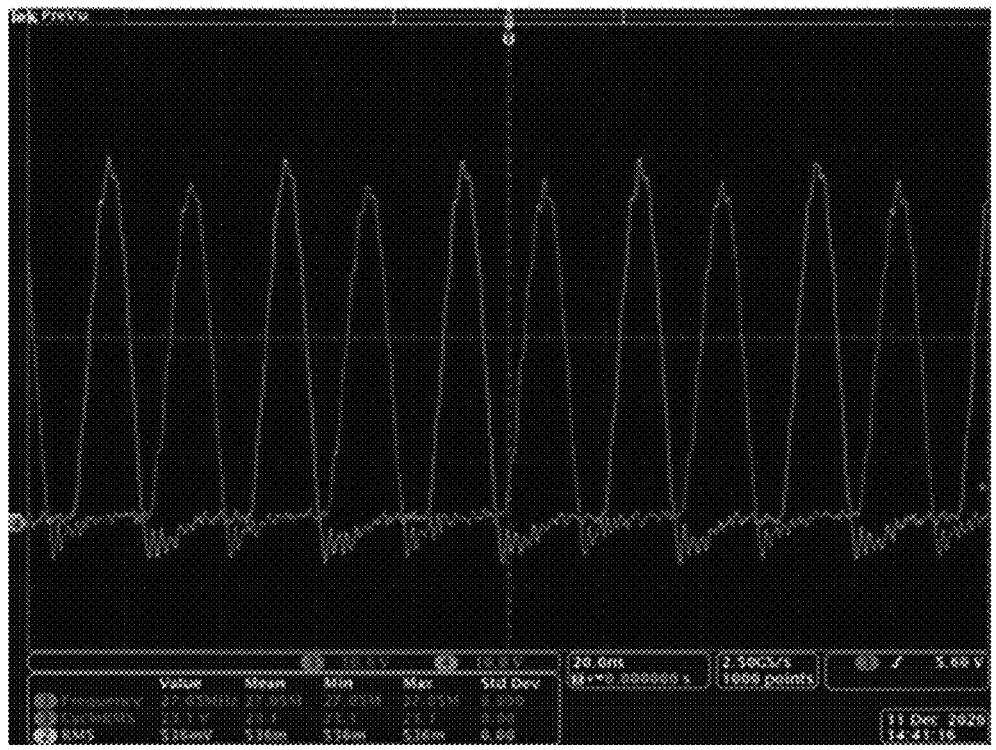
FIG. 27B is a graph of switch node voltages of a wireless power transfer system at a full load condition operating in the reverse power flow direction in accordance with an aspect of the subject disclosure.

FIGS. 27A and 27B are graphs of switch node voltages of the amplifier 215 on the PCB 602 at no-load condition, and full load conditions, respectively.

Although embodiments have been described above with reference to the figures, those of skill in the art will appreciate that variations and modifications may be made without departing from the scope of the subject disclosure and the following claims.

What is claimed is:

1. A bidirectional wireless power transfer system for transferring power, the system comprising:
a transceiver element for transferring power by generating an electric field and/or a magnetic field, and for extracting power from a generated electric field and/or a generated magnetic field;
a power stage electrically connected to the transceiver element, the power stage for inverting an inputted power signal and for rectifying a received power signal;
a trigger circuit for synchronizing wireless power transfer;
a clock generator for generating a clock signal; and
a switching element electrically connected to the power stage, and selectively electrically connected to the trigger circuit and the clock generator, such that:
when the switching element electrically connects the clock generator to the power stage, the transceiver element is configured to transfer power by generating an electric field and/or a magnetic field, and
when the switching element electrically connects the trigger circuit to the power stage, the transceiver element is configured to extract power from a generated electric field and/or a generated magnetic field.

2. The system of claim 1, wherein the clock generator generates the clock signal to control the power stage.

3. The system of claim 1, wherein the power stage comprises an amplifier.

4. The system of claim 3, wherein the amplifier is a class E power amplifier.

5. The system of claim 1, wherein the power stage comprises an input stage.

6. The system of claim 5, wherein the input stage comprises a matching network.

7. The system of claim 6, wherein the matching network comprises a single impedance inverter or a double impedance inverter.

8. The system of claim 1, wherein the power stage comprises a gate driver for controlling the power stage.

9. The system of claim 1, wherein the clock generator comprises an oscillator.

10. The system of claim 1, wherein the trigger circuit is for controlling operation of the power stage to synchronize a power signal received by the transceiver element.

11. The system of claim 1, wherein the trigger circuit comprises a sampling circuit for sampling current or voltage.

12. The system of claim 11, wherein the sampling circuit is configured to sample current or sample voltage.

13. The system of claim 12, wherein the current being sampled is load independent.

14. The system of claim 12, wherein the voltage is load independent.

15. The system of claim 1, further comprising a converter for converting a voltage of a power signal.

16. The system of claim 15, wherein the converter is a bidirectional buck-boost converter.

17. A wireless power transfer system comprising:
a transmitter for wirelessly transferring power via magnetic and/or electric field coupling, the transmitter comprising:
a first transceiver element for transferring power by generating an electric field and/or a magnetic field, and for extracting power from a generated electric field and/or a generated magnetic field;
a first power stage electrically connected to the first transceiver element, the first power stage for inverting an inputted power signal in a forward power flow direction and for rectifying a received power signal in a reverse power flow direction;
a first trigger circuit for synchronizing wireless power transfer;

a first clock generator for generating a clock signal; and
a first switching element electrically connected to the first power stage, and selectively electrically connected to the first trigger circuit and the first clock generator, such that:
- when the first switching element electrically connects the first clock generator to the first power stage, the first transceiver element is configured to transfer power by generating an electric field and/or a magnetic field, and
- when the first switching element electrically connects the first trigger circuit to the first power stage, the first transceiver element is configured to extract power from a generated electric field and/or a generated magnetic field;

a receiver for wirelessly extracting power via magnetic or electric field coupling, the receiver comprising:
- a second transceiver element for transferring power by generating an electric field and/or a magnetic field, and for extracting power from a generated electric field and/or a generated magnetic field;
- a second power stage electrically connected to the second transceiver element, the second power stage for inverting an inputted power signal in the reverse power flow direction and for rectifying a received power signal in the forward power flow direction;
- a second trigger circuit for synchronizing wireless power transfer;
- a second clock generator for generating a clock signal; and
- a second switching element electrically connected to the second power stage, and selectively electrically connected to the second trigger circuit and the second clock generator, such that:
  - when the second switching element electrically connects the second clock generator to the second power stage, the second transceiver element is configured to transfer power by generating an electric field and/or a magnetic field to the transmitter, and
  - when the switching element electrically connects the second trigger circuit to the second power stage, the second transceiver element is configured to extract power from a generated electric field and/or a generated magnetic field from the transmitter.

18. A method of operating a bidirectional wireless power transfer system, the system comprising:
- a transceiver element for transferring power by generating an electric field and/or a magnetic field, and for extracting power from a generated electric field and/or a generated magnetic field;
- a power stage electrically connected to the transceiver element, the power stage for inverting an inputted power signal and for rectifying a received power signal;
- a trigger circuit for synchronizing wireless power transfer;
- a clock generator for generating a clock signal; and
- a switching element electrically connected to the power stage, and selectively electrically connected to the trigger circuit and the clock generator, such that:
  - when the switching element electrically connects the clock generator to the power stage, the transceiver element is configured to transfer power by generating an electric field and/or a magnetic field, and
  - when the switching element electrically connects the trigger circuit to the power stage, the transceiver element is configured to extract power from a generated electric field and/or a generated magnetic field, the method comprising:
- connecting the power stage to the trigger circuit to extract power, or
- connecting the power stage to the clock generator to transfer power.

19. The method of claim 18, wherein connecting the power stage to the trigger circuit or the clock generator comprises operating the switching element.

20. The method of claim 18, further comprising disconnecting the power stage from the clock generator, or disconnecting the power stage from the trigger circuit, wherein disconnecting the power stage from the trigger circuit or the clock generator comprises operating the switching element.

* * * * *